(12) United States Patent
Yamada et al.

(10) Patent No.: US 8,697,315 B2
(45) Date of Patent: Apr. 15, 2014

(54) PHOTOMASK BLANK AND PRODUCTION METHOD THEREOF, AND PHOTOMASK PRODUCTION METHOD, AND SEMICONDUCTOR DEVICE PRODUCTION METHOD

(75) Inventors: Takeyuki Yamada, Tokyo (JP); Atsushi Kominato, Tokyo (JP); Hiroyuki Iwashita, Tokyo (JP); Masahiro Hashimoto, Tokyo (JP); Yasushi Okubo, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/347,425

(22) Filed: Jan. 10, 2012

(65) Prior Publication Data

US 2012/0129084 A1 May 24, 2012

Related U.S. Application Data

(62) Division of application No. 12/066,360, filed on Jul. 30, 2008, now Pat. No. 8,114,556.

(30) Foreign Application Priority Data

| Sep. 9, 2005 | (JP) | 2005-261667 |
| Sep. 21, 2005 | (JP) | 2005-274750 |
| Sep. 30, 2005 | (JP) | 2005-286165 |

(51) Int. Cl.
  *G03F 1/00* (2012.01)
(52) U.S. Cl.
  USPC ............................................................. 430/5
(58) Field of Classification Search
  USPC ................................................... 430/5, 194
  See application file for complete search history.

(56) References Cited

U.S. PATENT DOCUMENTS

| 4,522,842 A | 6/1985 | Levinstein et al. |
| 4,720,442 A * | 1/1988 | Shinkai et al. .................... 430/5 |

(Continued)

FOREIGN PATENT DOCUMENTS

| JP | 61-198156 A | 9/1986 |
| JP | 62-32782 B2 | 7/1987 |

(Continued)

OTHER PUBLICATIONS

Korean Office Action issued Apr. 1, 2013 in corresponding Korean Patent Application No: 10-2012-7033552.

(Continued)

*Primary Examiner* — Mark F Huff
*Assistant Examiner* — Rashid Alam
(74) *Attorney, Agent, or Firm* — Sughrue Mion, PLLC

(57) ABSTRACT

A photomask blank which is capable of preventing static buildup caused by electron beam pattern drawing for forming a resist pattern. The photomask blank provides a good pattern accuracy through optimization of the dry etching rate along the depth direction of the shielding film, and is capable of reducing the dry etching time by increasing the dry etching rate of the shielding film. The photomask blank includes a translucent substrate having thereon a shielding film composed mainly of chromium and the shielding film contains hydrogen. The shielding film is formed in such a manner that the film formation rate of the layer at the surface side is lower than the film formation rate of the layer at the translucent substrate side of the shielding film. The dry etching rate of the shielding film is lower at the translucent substrate side than at the surface side.

20 Claims, 4 Drawing Sheets

(56) References Cited

U.S. PATENT DOCUMENTS

| | | |
|---|---|---|
| 5,830,332 A | 11/1998 | Babich et al. |
| 6,899,979 B1 | 5/2005 | Mitsui et al. |
| 2002/0119380 A1* | 8/2002 | Zemen et al. .................. 430/5 |
| 2002/0136966 A1* | 9/2002 | Shinagawa et al. ............ 430/5 |
| 2004/0072016 A1 | 4/2004 | Okazaki et al. |
| 2004/0161674 A1 | 8/2004 | Nozute |
| 2005/0142463 A1 | 6/2005 | Mitsui et al. |
| 2006/0057469 A1* | 3/2006 | Kureishi et al. ............... 430/5 |

FOREIGN PATENT DOCUMENTS

| | | |
|---|---|---|
| JP | 3-43736 A | 2/1991 |
| JP | 6-69185 A | 3/1994 |
| JP | 10-69055 A | 3/1998 |
| JP | 11-223931 A | 8/1999 |
| JP | 2983020 B1 | 9/1999 |
| JP | 11-316454 A | 11/1999 |
| JP | 2002-189281 A | 7/2002 |
| JP | 2002-244274 A | 8/2002 |
| JP | 2005-43646 A | 2/2005 |
| KR | 10-0424853 B1 | 3/2004 |
| KR | 10-2004-0032065 A | 4/2004 |
| WO | 00/07072 A1 | 2/2000 |
| WO | 2004-070472 | 8/2004 |
| WO | WO 2004070472 A1 * | 8/2004 |

OTHER PUBLICATIONS

Korean Office Action issued Apr. 23, 2013 in corresponding Korean Patent Application No: 10-2008-7008476.

Korean Office Action issued Apr. 1, 2013 in corresponding Korean Patent Application No: 9-5-2013-022370587.

Korean Office Action issued Apr. 23, 2013 in corresponding Korean Patent Application No:9-5-2013-027247125.

* cited by examiner

PHOTOMASK BLANK AND PRODUCTION METHOD THEREOF, AND PHOTOMASK PRODUCTION METHOD, AND SEMICONDUCTOR DEVICE PRODUCTION METHOD

CROSS REFERENCE TO RELATED APPLICATIONS

This is a divisional of application Ser. No. 12/066,360 filed Jul. 30, 2008. The entire disclosure of the prior application, application Ser. No. 12/066,360, as well as the content of the National Stage of International Application No. PCT/JP2006/317893 filed on Sep. 8, 2006, claiming priority based on Japanese Patent Application Nos. 2005-261667, filed Sep. 9, 2005, 2005-274750 filed Sep. 21, 2005, and 2005-286165 filed Sep. 30, 2005, the contents of all of which are incorporated herein by reference in their entirety.

TECHNICAL FIELD

The present invention relates to an optimum shielding film for use in electron beam drawing on a resist film formed on a photomask blank, a photomask blank including a shielding film having optimum properties for dry etching through which a shielding pattern is formed, a method for producing a photomask, and a method for producing a semiconductor device. The present invention also relates to a photomask blank including a shielding film providing an optimum dry etching rate for dry etching for forming a shielding film pattern, a method for producing a photomask, and a method for producing a semiconductor device.

BACKGROUND ART

In common production processes for semiconductor devices, fine patterns have been formed by photolithography. The formation of a fine pattern usually requires many substrates called photomasks. A common photomask is composed of a translucent glass substrate having thereon a shielding fine pattern composed of a metal thin film. The production of the photomask involves use of a photomask blank composed of a translucent substrate such as a glass substrate having thereon a shielding film. The production of the photomask with the photomask blank includes an exposure step (or drawing step) of subjecting a resist film formed on a photomask blank to intended pattern exposure (or pattern drawing), a development step of developing the resist film to form a resist pattern according to the intended pattern exposure (or pattern drawing), an etching step of etching the shielding film along the resist pattern, and a removal step of removing the residual portions of the resist pattern. In the development step, the resist film formed on the photomask blank is subjected to intended pattern exposure (or pattern drawing), then a developing solution is fed to the resist film thereby dissolving the portions soluble in the developing solution, and thus a resist pattern is formed. In the etching step, the resist pattern is used as a mask, and the exposed areas on the shielding film having no resist pattern are dissolved by, for example, wet etching, and thus an intended mask pattern is formed on the translucent substrate. In this way, a photomask is produced.

Patent Document 1 describes a mask blank suitable for wet etching, wherein the mask blank is a photomask blank including a transparent substrate having thereon a shielding film composed of a chromium film containing chromium carbide. Patent Document 2 also describes a mask blank suitable for wet etching, wherein the mask blank is a halftone phase shift mask blank including a transparent substrate having thereon a laminated film composed of a halftone material film and a metal film. From the surface side toward the transparent substrate side of the metal film, there are regions composed of different materials etched at different rates. The halftone phase shift mask blank is composed of, for example, a CrN/CrC metal film (a metal film wherein CrN and CrC are laminated in this order from the transparent substrate side, hereinafter the same) and a CrON antireflection film.

Miniaturization of the pattern of a semiconductor device requires miniaturization of the mask pattern formed on the photomask, and shortening of the exposure wavelength used for photolithography. In recent years, exposure sources having shorter wavelengths have been used for the production of semiconductor devices, so that a KrF excimer laser (wavelength: 248 nm) has been replaced with an ArF excimer laser (wavelength: 193 nm), and then a F2 excimer laser (wavelength: 157 nm). On the other hand, regarding photomasks and photomask blanks, miniaturization of a mask pattern formed on a photomask requires the reduction of the thickness of the resist film on a photomask blank, and replacement of the conventional wet etching process with a dry etching process as the patterning technique in the photomask production.

However, the reduction of the thickness of the resist film and the dry etching process present the following technical problems.

The first is that the reduction of the thickness of a resist film on a photomask blank is significantly limited by the processing time of the shielding film. A shielding film is commonly made of a chromium-based material, and chromium is dry-etched using a mixed gas composed of chlorine and oxygen. When a shielding film is patterned by dry etching with a resist pattern as a mask, the resist is very susceptible to oxygen plasma contained in the dry etching atmosphere because the resist is an organic film composed mainly of carbon. During patterning of a shielding film by dry etching, the resist pattern formed on the shielding film must have an adequate thickness. As an index, in order to form a mask pattern having a good sectional shape, the resist film must have a sufficient thickness so as to remain after etching for a period of about twice the clear etching time (100% over-etching). For example, etching selectivity between chromium composing the shielding film and the resist film is usually 1 or less, so that the thickness of the resist film must be twice or more the thickness of the shielding film. The processing time of the shielding film may be reduced, for example, by reducing the thickness of the shielding film. The reduction of the thickness of the shielding film is proposed in Patent Document 3.

Patent Document 3 discloses a method for producing a photomask, wherein the shape of a chromium pattern is improved by reducing the thickness of a chromium shielding film on a transparent substrate thereby reducing the etching time.

Patent Document 1: Japanese Examined Patent Application Publication (JP-B) No. 62-32782
Patent Document 2: Japanese Patent (JP-B) No. 2983020
Patent Document 3: Japanese Unexamined Patent Application Publication (JP-A) No. 10-69055

DISCLOSURE OF INVENTION

Problems to be Solved by Invention

However, reduction of the thickness of the shielding film brings about insufficient shielding properties, and pattern transfer using the resultant photomask results in a bad transfer pattern. A shielding film must have a certain optical density to provide sufficient shielding properties. Therefore, the reduction of the thickness of the shielding film as described in Patent Document 3 is inevitably limited.

When the chromium film containing a chromium carbide described in Patent Document 1 is used as a shielding film, the dry etching rate tends to decrease, which hinders the reduction of the processing time of the dry etching of the shielding film.

In the CrN/CrC metal film described in Patent Document 2 wherein the wet etching rate varies in the film thickness direction, the CrC film must have a larger thickness than the CrN film. The reasons for this are as follows. Firstly, the wet etching rates of the upper CrC film and the lower CrN film are favorable, but because nitrogen is contained in the lower layer, a large undercut is produced by wet etching. Therefore, the thickness of the CrN film must be relatively smaller. Secondly, the absorption coefficient of the CrN film for i-line (365 nm) or a KrF excimer laser beam (248 nm), the wavelengths of which are used in known exposure devices, is small, so that the thickness of the CrC film having high shielding properties must be considerably higher thereby achieving an intended optical density of a shielding film. Thirdly, exposure (drawing) for forming a resist pattern on a shielding film usually uses an electron beam, but the oxygen-containing CrON film formed on the CrN/CrC metal film described in Patent Document 2 usually provides high insulation, so that prevention of static buildup requires thickening of the CrC film thereby reducing the sheet resistance of the shielding film. However, in the mask blank described in Patent Document 2, the carbon content in the metal film is so high that the etching rate is low during patterning by dry etching, so that the processing time of the shielding film cannot be reduced. Therefore, the mask blank is not suitable for dry etching. When the mask blank of Patent Document 2 is used for dry etching, the dry etching rate is high at first, but as the etching proceeds along the depth direction of the shielding film, the etching rate decreases in the CrC film region, and increases again in the final CrN film region. Therefore, degradation of the sectional shape of the pattern and a global loading phenomenon tend to occur. In recent years, in order to improve the resolution of resist patterns to meet the demand for miniaturization of patterns, chemically amplified resists having a high resolution have been used. Electron beam drawing on a chemically amplified resist is carried out under an electron beam accelerating voltage of 50 keV or more, so that shielding films are required to have improved electrical conductivity thereby reliably preventing static buildup.

The present invention has been made to solve the above problems of the related art. A first object of the present invention is to provide a photomask blank and a method for producing a photomask, wherein the photomask blank prevents static buildup caused by electron beam drawing for forming a resist pattern on a shielding film. A second object of the present invention is to provide a photomask blank and a method for producing a photomask, wherein the photomask blank provides an optimum dry etching rate along the depth direction of the shielding film thereby reducing the occurrence of a global loading phenomenon and providing a good pattern accuracy. A third object of the present invention is to provide a photomask blank and a method for producing a photomask, wherein the photomask blank increases the dry etching rate of the shielding film thereby reducing the dry etching time to reduce the shrinkage of the resist film, which results in the reduction of the thickness of the resist film to improve the resolution and pattern accuracy (CD accuracy), and the formation of a shielding film pattern having a good sectional shape due to the reduction of the dry etching time. A fourth object of the invention is to provide a photomask blank and a method for producing a photomask, wherein the photomask blank forms a shielding film pattern having a good sectional shape due to the reduction of the thickness of the shielding film with necessary shielding performance maintained.

Means for Solving the Problems

In order to solve the above-described problems, the present invention includes the following structures.

(Structure 1)

A photomask blank, comprising a translucent substrate having thereon a shielding film composed mainly of a chromium-containing material, wherein the shielding film is composed of a hydrogen-containing material.

(Structure 2)

The photomask blank according to structure 1, wherein the hydrogen content in the shielding film is 1 at % or more.

(Structure 3)

The photomask blank according to structure 1 or 2, wherein the shielding film is composed of hydrogen in almost all regions along a depth direction from a surface side toward a translucent substrate side of the shielding film.

(Structure 4)

The photomask blank according to any one of structures 1 to 3, wherein the shielding film is composed of different regions having different hydrogen contents such that a hydrogen content varies from a surface side toward a translucent substrate side of the shielding film.

(Structure 5)

The photomask blank according to structure 4, wherein the hydrogen content in the shielding film continuously or gradually decreases from the surface side toward the translucent substrate side of the shielding film.

(Structure 6)

The photomask blank according to any one of structures 1 to 5, further comprising an antireflective layer containing oxygen in an upper layer of the shielding film.

(Structure 7)

The photomask blank according to any one of structures 1 to 6, wherein the shielding film has a thickness to give an optical density of 2.5 or more for exposure light.

(Structure 8)

The photomask blank according to any one of structures 1 to 7, wherein the photomask blank is a dry etching photomask blank suitable for use with the method for producing a photomask, in which the shielding film is patterned by dry etching using the mask pattern formed on the shielding film as a mask.

(Structure 9)

The photomask blank according to any one of structures 1 to 8, wherein a halftone phase shifter film is formed between the translucent substrate and the shielding film.

(Structure 10)

The photomask blank according to structure 9, wherein the shielding film has a thickness to give an optical density of 2.5 or more for exposure light in a laminated structure comprising the halftone phase shifter film.

(Structure 11)

A method for producing a photomask, comprising the step of patterning the shielding film of the photomask blank according to any one of structures 1 to 10 to form a shielding film pattern on the translucent substrate.

(Structure 12)
A method for producing a photomask comprising the steps of patterning the shielding film of the photomask blank according to structure 9 or 10 by etching to form a shielding film pattern, and then patterning the halftone phase shifter film by etching using the shielding film pattern as a mask to form a halftone phase shifter film pattern on the translucent substrate.

(Structure 13)
The method for producing a photomask according to structure 11 or 12, wherein the shielding film is patterned by dry etching using the mask pattern formed on the shielding film as a mask.

(Structure 14)
The method for producing a photomask according to any one of structures 11 to 13, wherein the shielding film is patterned by steps of forming an electron beam drawing resist film on the shielding film, forming a resist pattern on the electron beam drawing resist film by predetermined electron beam drawing and development treatment, and then dry etching the shielding film with the resist pattern as a mask.

(Structure 15)
A method for producing a semiconductor device, comprising the step of transferring the shielding film pattern or the halftone phase shifter film pattern from the photomask according to any one of structures 11 through 14 to a semiconductor substrate by photolithography.

(Structure 16)
A method for producing a photomask blank, comprising the step of forming a shielding film on a translucent substrate by sputtering, wherein the photomask blank is a dry etching photomask blank suitable for use with the method for producing a photomask wherein the shielding film is patterned by dry etching using the mask pattern formed on the shielding film as a mask, the shielding film being formed in such a manner that a film formation rate of the layer at a surface side is lower than a film formation rate of a layer at a translucent substrate side of the shielding film.

(Structure 17)
The method for producing a photomask blank according to structure 16, wherein a ratio between the formation rate of the layer in the translucent substrate side of the shielding film and the formation rate of the layer at the surface side of the shielding film (the layer formed at the translucent substrate side: the layer formed at the surface side of the shielding film) is from 2.5:1 to 4.0:1.

(Structure 18)
The method for producing a photomask blank according to structure 16 or 17, wherein the shielding film comprises a chromium-containing material, and further comprises at least one of oxygen and nitrogen.

(Structure 19)
The method for producing a photomask blank according to any one of structures 16 to 18, comprising the step of forming an oxygen-containing antireflective layer in the upper layer of the shielding film.

(Structure 20)
The method for producing a photomask blank according to structure 19, wherein the layer formed at the surface side of the shielding film is the antireflective layer.

(Structure 21)
The method for producing a photomask blank according to any one of structures 16 to 20, wherein the shielding film has a thickness to give an optical density of 2.5 or more for exposure light.

(Structure 22)
The method for producing a photomask blank according to any one of structures 16 to 21, which comprises the step of forming a halftone phase shifter film between the translucent substrate and the shielding film.

(Structure 23)
The method for producing a photomask blank according to structure 22, wherein the shielding film has a thickness to give an optical density of 2.5 or more for exposure light in a laminated structure comprising the halftone phase shifter film.

(Structure 24)
A method for producing a photomask, comprising the step of patterning the shielding film of the photomask blank according to any one of structures 16 to 23 by dry etching to form a shielding film pattern on the translucent substrate.

(Structure 25)
A method for producing a photomask, comprising the steps of patterning the shielding film of the photomask blank according to structure 22 or 23 by dry etching to form a shielding film pattern, and then forming the halftone phase shifter film pattern by dry etching using the shielding film pattern as a mask.

(Structure 26)
A method for producing a semiconductor device, comprising the step of transferring the shielding film pattern or the halftone phase sifter film pattern from the photomask according to structure 24 or 25 to a semiconductor substrate by photolithography.

(Structure 27)
A photomask blank, comprising a translucent substrate having thereon a shielding film, wherein the photomask blank is a dry etching photomask blank suitable for use with the method for producing a photomask wherein the shielding film is patterned by dry etching using a mask pattern formed on the shielding film as a mask, the dry etching rate of the shielding film being lower at a translucent substrate side than at a surface side.

(Structure 28)
The photomask blank according to structure 27, wherein the dry etching rate decreases from the surface side toward the translucent substrate side of the shielding film.

(Structure 29)
The photomask blank according to structure 27 or 28, wherein the shielding film is composed mainly of a chromium-containing material.

(Structure 30)
The photomask blank according to any one of structures 27 to 29, wherein the shielding film further comprises oxygen, and a oxygen content decreases from the surface side toward the translucent substrate side of the shielding film.

(Structure 31)
The photomask blank according to any one of structures 27 to 30, wherein the shielding film further comprises nitrogen.

(Structure 32)
The photomask blank according to structure 31, wherein the shielding film comprises nitrogen in almost all regions along a depth direction from the surface side toward the translucent substrate side of the shielding film.

(Structure 33)
The photomask blank according to any one of structures 27 to 32, wherein an oxygen-containing antireflective layer is formed in an upper layer of the shielding film.

(Structure 34)
The photomask blank according to any one of structures 27 to 33, wherein a halftone phase shifter film is formed between the translucent substrate and the shielding film.

(Structure 35)

A photomask blank, comprising a translucent substrate having thereon a shielding film, wherein the photomask blank is a dry etching photomask blank suitable for use with the method for producing a photomask wherein the shielding film is patterned by dry etching using the mask pattern formed on the shielding film as a mask, the shielding film containing nitrogen in almost all regions along a depth direction from a surface side toward a translucent substrate side of the shielding film, an oxygen content in the shielding film decreasing from a surface side toward a translucent substrate side.

(Structure 36)

The photomask blank according to structure 35, wherein the shielding film is composed mainly of a chromium-containing material.

(Structure 37)

The photomask blank according to structure 36, wherein a nitrogen content in the regions from the surface side toward the translucent substrate side of the shielding film is from 0.5 to 0.8 with reference to a proportion of chromium contained in the shielding film.

(Structure 38)

The photomask blank according to any one of structures 35 to 37, wherein an oxygen-containing antireflective layer is formed in an upper layer of the shielding film.

(Structure 39)

The photomask blank according to any one of structures 35 to 38, wherein a halftone phase shifter film is formed between the translucent substrate and the shielding film.

(Structure 40)

A method for producing a photomask, comprising the step of patterning the shielding film of the photomask blank according to any one of structures 27 to 39 by dry etching to form a shielding film pattern on the translucent substrate.

(Structure 41)

A method for producing a photomask, comprising steps of patterning the shielding film of the photomask blank according to structure 34 or 39 by dry etching to form a shielding film pattern, and then forming the halftone phase shifter film pattern by dry etching using the shielding film pattern as a mask.

(Structure 42)

A method for producing a semiconductor device comprising the step of transferring the shielding film pattern or the halftone phase shifter film pattern from the photomask according to structure 40 or 41 to a semiconductor substrate by photolithography.

As in the structure 1, a photomask blank according to the present invention comprises a translucent substrate having thereon a shielding film composed mainly of a chromium-containing material. In the photomask blank, the shielding film is composed of a hydrogen-containing material.

Thus, the hydrogen contained in the shielding film composed mainly of a chromium-containing material decreases the sheet resistance and increases the electrical conductivity of the shielding film. This prevents static buildup on the shielding film during electron beam pattern drawing on the shielding film for forming a resist pattern, and thus prevents the failure in accurate pattern drawing and the destruction of the shielding film pattern by discharge. In addition, the shielding film has improved electrical conductivity due to the hydrogen contained in the shielding film even when the carbon content in the shielding film, which decreases the dry etching rate, is decreased and the shielding film has a specified thickness with the intention of making a shielding film suitable for dry etching. The hydrogen contained in the shielding film also reduces the dry etching time, and reduces the shrinkage of the resist film. This allows the reduction of the thickness of the resist film thereby improving the pattern resolution and pattern accuracy (CD accuracy). In addition, the reduction of the etching time allows the production of a photomask blank which forms a shielding film pattern having a good sectional shape.

From the viewpoints of the electrical conductivity of the shielding film and the reduction of the etching time, according to the structure 2, the hydrogen content contained in the shielding film is preferably 1 at % or more.

In addition, from the viewpoints of the electrical conductivity of the shielding film and the reduction of the etching time, according to the structure 3, the shielding film preferably contains hydrogen in almost all regions along the depth direction from the surface side toward the translucent substrate side of the shielding film.

According to the structure 4, in the photomask blank of the present invention, the shielding film may include different regions having different hydrogen contents such that the hydrogen content varies from the surface side toward the translucent substrate side of the shielding film. For example, the hydrogen content in the region at the shielding film surface side may be increased to increase the electrical conductivity, thereby improving the antistatic effect. According to the structure 5, the shielding film may be a graded composition film wherein the hydrogen content continuously or gradually decreases from the surface side toward the translucent substrate side (or along the depth direction) of the shielding film, thereby decreasing the dry etching rate along the depth direction of the shielding film. This reduces line width errors caused by the global loading phenomenon during dry etching.

According to the structure 6, the shielding film may include an oxygen-containing antireflective layer in the upper layer region. The antireflective layer limits the reflectance at the exposure wavelength to a low value, which prevents multiple reflection between the shielding film and the exposed surface during transfer of the mask pattern to the receiving medium, and thus prevents the deterioration of the imaging properties. In addition, the reflectance at the wavelengths used for the defect inspection on photomask blanks and photomasks (for example, 257 nm, 364 nm, and 488 nm) is limited to a low value, which improves the accuracy in defect inspection.

According to the structure 7, when the photomask blank of the present invention is, for example, a photomask blank for binary masking, the shielding film has a thickness to give an optical density of 2.5 or more upon exposure.

According to the structure 8, the photomask blank of the present invention is a dry etching photomask blank suitable for use with the method for producing a photomask wherein the shielding film is patterned by dry etching using the mask pattern formed on the shielding film as a mask. The hydrogen contained in the shielding film increases the dry etching rate thereby reducing the etching time and thus reducing the shrinkage of the resist film. This allows the reduction of the thickness of the resist film to improve the pattern accuracy (CD accuracy), and the reduction of the etching time allows the formation of a shielding film pattern having a good sectional shape.

According to the structure 9, a halftone phase shifter film may be formed between the translucent substrate and the shielding film. In this case, according to the structure 10, the shielding film gives an optical density of 2.5 or more upon exposure in the laminated structure including the halftone phase shifter film.

According to the structure 11, a photomask having a shielding film pattern having a good resolution, a good position accuracy, and a good sectional shape is obtained by the method for producing a photomask including a step of patterning a shielding film of the photomask blank according to any one of the structures 1 to 10 thereby forming a shielding film pattern on a translucent substrate.

According to the structure 12, a photomask having an accurate halftone phase shifter film pattern having a good sectional shape is obtained by the method for producing a photomask including steps of patterning a shielding film of the photomask blank according to the structure 9 or 10 by etching thereby forming a shielding film pattern, and then patterning a halftone phase shifter film by etching using the shielding film pattern as a mask thereby forming a halftone phase shifter film pattern on a translucent substrate.

According to the structure 13, a photomask having an accurate shielding film pattern with a good sectional shape is obtained with a shorter dry etching time by the method for producing a photomask including a step of dry etching the shielding film using the mask pattern formed on the shielding film as a mask.

According to the structure 14, static buildup on a shielding film during electron beam pattern drawing on the shielding film for forming a resist pattern is prevented, and thus the failure in accurate pattern drawing or the destruction of the shielding film pattern by discharge is prevented by the method for producing a photomask wherein patterning of the shielding film is carried out by forming an electron beam drawing resist film on the shielding film, forming a resist pattern on the electron beam drawing resist film by predetermined electron beam drawing and development treatment, and then dry etching the shielding film with the resist pattern as a mask.

According to the structure 15, a semiconductor device having no defect in the circuit pattern formed on the semiconductor substrate is produced by transferring the shielding film pattern or the halftone phase shifter film pattern from the photomask according to structure 14 or 15 to a semiconductor substrate by photolithography.

According to the structure 16, the method of the present invention for producing a photomask blank includes a step of forming a shielding film on a translucent substrate by sputtering, wherein the photomask blank is a dry etching photomask blank suitable for use with the method for producing a photomask wherein the shielding film is patterned by dry etching using the mask pattern formed on the shielding film as a mask, and the shielding film is formed in such a manner that the film formation rate of the layer at the surface side is lower than the film formation rate of the layer at the translucent substrate side of the shielding film.

When the film formation rate of the layer at the surface side of the shielding film is lower than the film formation rate of the layer at the translucent substrate side of the shielding film, the dry etching rate decreases along the depth direction of the shielding film (more specifically, from the surface side toward the translucent substrate side of the shielding film). This reduces the occurrence of the global loading phenomenon, and improves the pattern accuracy.

As the dry etching rate at the translucent substrate side approaches the dry etching rate at the surface side, the difference in CD bias caused by a crude pattern, more specifically the global loading error increases. When the dry etching rate at the translucent substrate side is adequately lower than the dry etching rate at the surface side, the global loading error decreases, and the pattern accuracy is improved.

More specifically, according to the structure 17, the ratio between the formation rate of the layer in the translucent substrate side of the shielding film and the formation rate of the layer at the surface side of the shielding film is preferably from 2.5:1 to 4.0:1.

According to the structure 18, in the photomask blank of the present invention, the shielding film is composed of a chromium-containing material, and preferably contains oxygen and/or nitrogen. The shielding film composed of chromium and these elements is dry-etched at a faster rate than a shielding film composed of chromium alone, and thus requires a shorter dry etching time. The increase of the dry etching rate allows the reduction of the thickness of the resist film necessary for patterning of the shielding film, which improves the pattern accuracy (CD accuracy) of the shielding film. The shielding film composed of chromium and these elements gives an intended optical density (for example, preferably 2.5 or more) upon exposure at 200 nm or less, which is an effective wavelength for achieving miniaturization of a pattern, without requiring the increase of the film thickness. More specifically, the reduction of the thickness of the shielding film is achieved with necessary shielding performance maintained.

According to the structure 19, the shielding film may include an oxygen-containing antireflective layer in the upper layer region. The antireflective layer limits the reflectance at the exposure wavelength to a low value, which prevents multiple reflection between the shielding film and the exposed surface during transfer of the mask pattern to the receiving medium, and thus prevents the deterioration of the imaging properties. In addition, the reflectance at the wavelengths used for the defect inspection on photomask blanks and photomasks (for example, 257 nm, 364 nm, and 488 nm) is limited to a low value, which improves the accuracy in defect inspection.

According to the structure 20, when an oxygen-containing antireflection film is formed in the upper layer region of the shielding film, the antireflective layer may be formed at a film formation rate lower than the film formation rate of the layer in the translucent substrate side. The oxygen-containing antireflective layer is formed in an atmosphere of oxygen-containing gas. However, for example, when a CrO film is formed by reactive sputtering in an atmosphere of oxygen-containing gas, film defects increase as the increase of the film formation rate through the increase of the power of the film formation apparatus. Therefore, the film formation rate is preferably lower for reducing film defects.

According to the structure 21, when the photomask blank of the present invention is, for example, a photomask blank for binary masking, the shielding film has a certain thickness to give an optical density of 2.5 or more upon exposure.

According to the structure 22, a halftone phase shifter film may be formed between the translucent substrate and the shielding film.

In this case, according to the structure 23, the shielding film gives an optical density of 2.5 or more upon exposure in the laminated structure including the halftone phase shifter film.

According to the structure 24, a photomask having an accurate shielding film pattern with a good sectional shape is obtained with a shorter dry etching time by the method for producing a photomask including a step of patterning the shielding film of the photomask blank obtained by the production method according to any one of the structures 16 to 23 by dry etching.

According to the structure 25, a photomask having an accurate halftone phase shifter film pattern having a good sectional shape is obtained by the method for producing a photomask including steps of patterning the shielding film of the photomask blank according to the structure 22 or 23 by dry etching thereby forming a shielding film pattern, and then patterning the halftone phase shifter film by dry etching using the shielding film pattern as a mask thereby forming a halftone phase shifter film pattern.

According to the structure 26, a semiconductor device having no defect in the circuit pattern formed on the semiconductor substrate is produced by transferring the shielding film pattern or the halftone phase shifter film pattern from the photomask according to the structure 14 or 15 to a semiconductor substrate by photolithography.

According to the structure 27, the photomask blank of the present invention is a dry etching photomask blank suitable for use with the method for producing a photomask wherein the shielding film is patterned by dry etching using the mask pattern formed on the shielding film as a mask, and the dry etching rate of the shielding film is lower at the translucent substrate side than at the surface side.

When the dry etching rate at the translucent substrate side is adequately lower than the dry etching rate at the surface side, global loading errors are reduced, and the pattern accuracy and the sectional shape of the pattern are improved.

As the dry etching rate at the translucent substrate side of the shielding film approaches the dry etching rate at the surface side, the difference in CD bias caused by a crude pattern, more specifically the global loading error increases. When the dry etching rate at the translucent substrate side is adequately lower than the dry etching rate at the surface side, global loading errors are reduced, and the pattern accuracy is improved.

According to the structure 28, the dry etching rate of the shielding film preferably decreases from the surface side toward the translucent substrate side of the shielding film. For example, the dry etching rate of the shielding film may gradually and/or continuously decreases from the surface side toward the translucent substrate side of the shielding film.

The material of the shielding film is imperviousness to exposure light, and examples thereof include materials containing a transition metal such as chromium, tantalum, titanium, molybdenum, or tungsten. According to the structure 29, the shielding film is preferably composed mainly of a chromium-containing material.

According to the structure 30, the photomask blank of the present invention preferably further contains oxygen. In this case, the oxygen content preferably decreases from the surface side toward the translucent substrate side (along the depth direction) of the shielding film. The shielding film composed of chromium and oxygen is dry-etched at a faster rate than a shielding film composed of chromium alone, and thus requires a shorter dry etching time. The increase of the dry etching rate allows the reduction of the thickness of the resist film necessary for patterning of the shielding film, which improves the pattern accuracy (CD accuracy) of the shielding film. In addition, when the oxygen content decreases along the depth direction of the shielding film, the dry etching rate decreases along the depth direction of the shielding film, which reduces the occurrence of the global loading phenomenon, and improves the pattern accuracy.

According to the structure 31, the photomask blank of the present invention preferably further contains nitrogen. The shielding film composed of chromium and nitrogen is dry-etched at a faster rate than a shielding film composed of chromium alone, and thus requires a shorter dry etching time. The increase of the dry etching rate allows the reduction of the thickness of the resist film necessary for patterning of the shielding film, which improves the pattern accuracy (CD accuracy) of the shielding film. The shielding film containing chromium and nitrogen gives an intended optical density (for example, preferably 2.5 or more) upon exposure at 200 nm or less, which is an effective wavelength for achieving miniaturization of a pattern, without requiring the increase of the film thickness, and achieves the reduction of the thickness of the shielding film with necessary shielding performance maintained. As described above, the shielding film containing oxygen (the structure 4) and nitrogen achieves the effect as described in the structure 5 more efficiently.

In particular, according to the structure 32, the shielding film preferably contains nitrogen in almost all regions along the film thickness direction from the surface side toward the translucent substrate side. It is more preferable that the shielding film contain nitrogen uniformly or almost uniformly along the film thickness direction from the surface side toward the translucent substrate side. More specifically, the nitrogen content in the regions from the surface side toward the translucent substrate side of the shielding film is preferably from 0.5 to 0.8 with reference to the proportion (composition ratio) of chromium contained in the regions from the surface side toward the translucent substrate side.

According to the structures 33 and 38, the shielding film may includes an oxygen-containing antireflective layer in the upper layer region. The antireflective layer limits the reflectance at the exposure wavelength to a low value, which prevents multiple reflection between the shielding film and the exposed surface during transfer of the mask pattern to the receiving medium, and thus prevents the deterioration of the imaging properties. In addition, the reflectance at the wavelengths used for the defect inspection on a photomask blank or a photomask (for example, 257 nm, 364 nm, and 488 nm) is limited to a low value, which improves the accuracy in defect inspection.

According to the structures 34 and 39, a halftone phase shifter film may be formed between the translucent substrate and the shielding film.

According to the structure 35, the photomask blank of the present invention is a dry etching photomask blank suitable for use with the method for producing a photomask wherein the shielding film is patterned by dry etching using the mask pattern formed on the shielding film as a mask, the shielding film contains nitrogen in almost all regions along the film thickness direction from the surface side toward the translucent substrate side of the shielding film, and the oxygen content decreases from the surface side toward the translucent substrate side of the shielding film.

The nitrogen contained in all over the regions along the film thickness direction from the surface side toward the translucent substrate side of shielding film allows the increase of the dry etching rate and the reduction of the thickness of the resist film necessary for patterning of the shielding film, which improves the pattern accuracy (CD accuracy) of the shielding film. In addition, when the oxygen content decreases along the depth direction of the shielding film, the dry etching rate decreases along the depth direction of the shielding film, which reduces the occurrence of the global loading phenomenon, and improves the pattern accuracy and the sectional shape of the pattern.

As described above, the material of the shielding film is imperviousness to exposure light, and examples thereof include materials containing a transition metal such as chromium, tantalum, titanium, molybdenum, or tungsten. According to the structure 36, the shielding film is preferably composed mainly of a chromium-containing material.

The shielding film preferably contains nitrogen uniformly or almost uniformly along the film thickness direction from the surface side toward the translucent substrate side. More specifically, the nitrogen content in the regions from the surface side toward the translucent substrate side of the shielding film is preferably from 0.5 to 0.8 with reference to the proportion (composition ratio) of chromium contained in the region from the surface side toward the translucent substrate side.

According to the structure 40, a photomask having an accurate shielding film pattern with a good sectional shape is obtained with a shorter dry etching time by the method for producing a photomask including a step of patterning the shielding film of the photomask blank according to any one of the structures 27 to 39 by dry etching.

According to the structure 41, a photomask having an accurate halftone phase shifter film pattern having a good sectional shape is obtained by the method for producing a photomask including steps of patterning the shielding film of the photomask blank according to the aspect 34 or 39 by dry etching thereby forming a shielding film pattern, and then patterning the halftone phase shifter film by dry etching using the shielding film pattern as a mask thereby forming a halftone phase shifter film pattern on the translucent substrate.

According to the structure 42, a semiconductor device having no defect in the circuit pattern formed on the semiconductor substrate is produced by transferring the shielding film pattern or the halftone phase shifter film pattern from the photomask according to the structure 40 or 41 to a semiconductor substrate by photolithography.

Advantages

The present invention provides a photomask blank which prevents static buildup on a shielding film during electron beam pattern drawing on the shielding film for resist pattern formation, and prevents the destruction of the mask pattern by discharge.

The present invention also provides a photomask blank which provides an optimum dry etching rate along the depth direction of the shielding film thereby reducing the occurrence of a global loading phenomenon and providing a good pattern accuracy.

The present invention also provides a photomask blank which provides an optimum dry etching rate along the depth direction of the shielding film such that the dry etching rate decreases along the depth direction of the shielding film, thereby reducing the occurrence of a global loading phenomenon and providing a good pattern accuracy.

The present invention increases the dry etching rate of the shielding film thereby reducing the dry etching time, and thus reducing the shrinkage of the resist film. This allows the reduction of the thickness of the resist film to improve the pattern resolution and pattern accuracy (CD accuracy). In addition, the reduction of the dry etching time allows the production of a photomask blank which forms a shielding film pattern having a good sectional shape.

The present invention also provides methods for producing a photomask blank and a photomask, which reduce the thickness of the shielding film with necessary shielding performance maintained, thereby forming a shielding film pattern having a good sectional shape.

REFERENCE NUMERALS

Figures 1, 2:
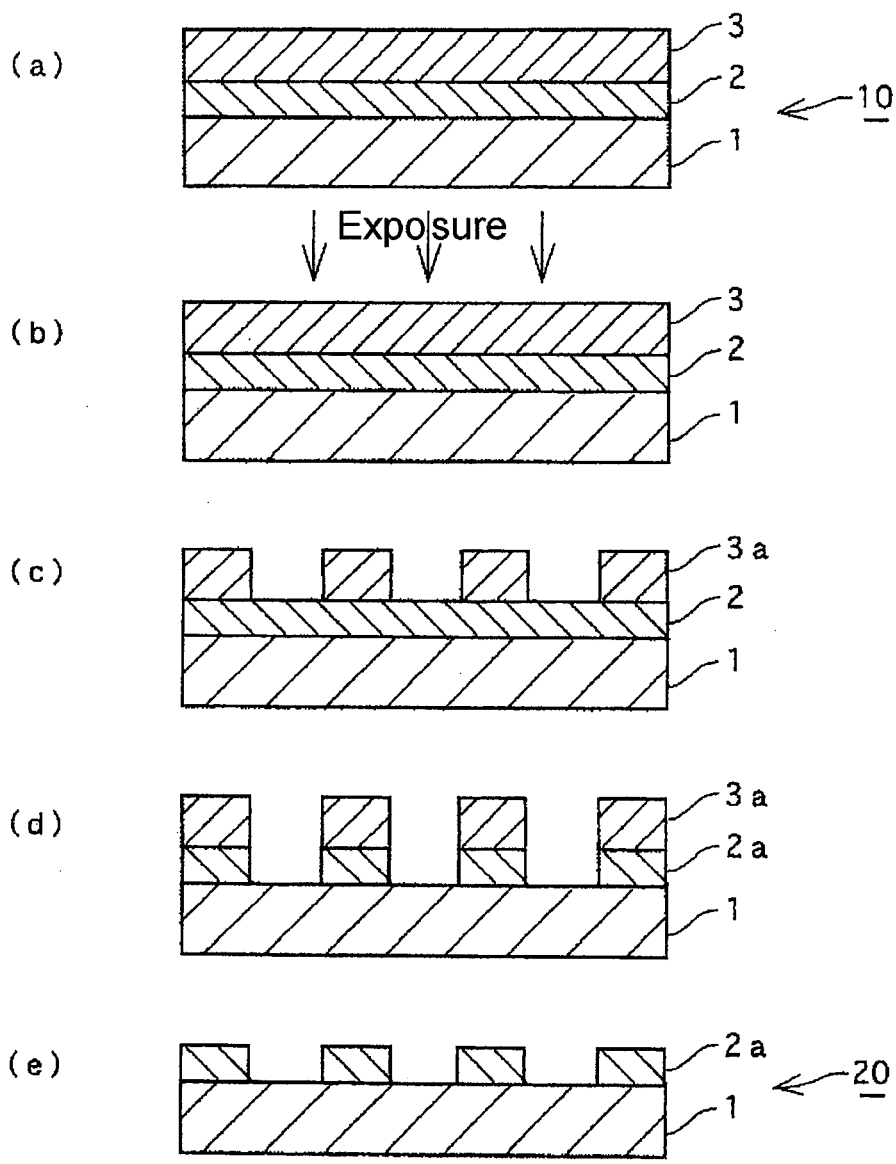
FIG. 1 shows a cross sectional view of an embodiment of the photomask blank of the present invention.
FIG. 2 shows cross sectional views of a production process for a photomask using a photomask blank.

1 translucent substrate
2 shielding film
3 resist film
4 halftone phase shifter film
5 shielding layer
6 antireflective layer
2a shielding film pattern
3a resist pattern
10, 30 photomask blank
20, 40 photomask

BEST MODES FOR CARRYING OUT THE INVENTION

The embodiments of the present invention are illustrated below with reference to the following drawings.

First Embodiment

FIG. 1 shows a cross sectional view of a first embodiment of the photomask blank of the present invention.

A photomask blank 10 shown in FIG. 1 is a photomask blank for binary masking, which includes a translucent substrate 1 having thereon a shielding film 2.

The photomask blank 10 is a dry etching photomask blank suitable for use with the method for producing a photomask wherein the shielding film 2 is patterned by dry etching using the resist pattern formed on the shielding film 2 by predetermined electron beam drawing and development treatment as a mask.

The translucent substrate 1 is usually a glass substrate. A glass substrate has excellent flatness and smoothness, so that allows highly accurate transfer of a pattern from a photomask to a semiconductor substrate without creating distortion of the transfer pattern.

The shielding film 2 is composed a chromium-containing material, and further contains a hydrogen. The hydrogen contained in the shielding film 2 composed of a chromium-based material decreases the sheet resistance of the shielding film, and increases the electrical conductivity. This prevents static buildup on the shielding film during electron beam pattern drawing on the shielding film for forming a resist pattern, and thus prevents the failure in accurate pattern drawing or the destruction of the shielding film pattern by discharge.

The hydrogen content in the shielding film 2 is preferably 1 at % or more. If the hydrogen content is less than 1 at %, it is difficult to decrease the sheet resistance of the shielding film thereby increasing the electrical conductivity. The shielding film must have an electrical conductivity which will not cause static buildup during patterning by electron beam drawing on the resist film formed on the shielding film. Accordingly, the sheet resistance of the shielding film is, for example, 150Ω/□ or less, preferably 100Ω/□ or less, and more preferably 50Ω/□ or less.

If the hydrogen content in the shielding film 2 is less than 1 at %, it is difficult to increase the dry etching rate of the shielding film.

The hydrogen content in the shielding film 2 is preferably 3 at % or more, and more preferably 5 at % or more. If the hydrogen content is more than 15 at %, chemical resistance (acid resistance and alkaline resistance) decreases.

The shielding film 2 may further contain oxygen, nitrogen, and carbon.

When the shielding film 2 contains oxygen, the oxygen content is preferably from 5 to 80 at %. If the oxygen content is less than 5 at %, it is difficult to increase the dry etching rate in comparison with that for a shielding film composed of chromium alone. On the other hand, if the oxygen content exceeds 80 at %, the absorption coefficient for a wavelength of 200 nm or less, for example, an ArF excimer laser beam (wavelength: 193 nm) decreases, so that the film thickness must be increased so as to give an intended optical density (2.5 or more). The oxygen content is preferably from 10 to 50 at %.

When the shielding film 2 contains nitrogen, the nitrogen content is preferably from 15 to 80 at %. If the nitrogen content is less than 15 at %, it is difficult to increase the dry etching rate in comparison with that for a shielding film composed of chromium alone. On the other hand, if the nitrogen content exceeds 80 at %, the absorption coefficient for a wavelength of 200 nm or less, for example, an ArF excimer laser beam (wavelength: 193 nm) decreases, so that the film thickness must be increased so as to give an intended optical density (2.5 or more). The nitrogen content is preferably from 20 to 50 at %.

The shielding film 2 may contain both of oxygen and nitrogen. In this case, the total content of oxygen and nitrogen is preferably from 10 to 80 at %. The ratio between the oxygen content and the nitrogen content in the shielding film 2 is not particularly limited, and may be appropriately established in consideration of, for example, the absorption coefficient.

When the shielding film 2 contains carbon, the carbon content is preferably from 1 to 20 at %. As is the case with hydrogen, carbon increases the electrical conductivity, or reduces the sheet resistance and reflectance. However, when the shielding film contains carbon, the dry etching rate decreases, which increases the dry etching time required for patterning of the shielding film by dry etching to hinder the reduction of the thickness of the resist film. From the above-described viewpoints, the carbon content is preferably from 1 to 20 at %, and more preferably from 3 to 15 at %.

The shielding film 2 may be monolayer or multilayer. It is preferable that hydrogen be contained in all the layers, more specifically, in almost all regions along the depth direction from the surface side toward the translucent substrate 1 side of the shielding film 2. It is more preferable that oxygen and/or nitrogen be contained in all the layers. For example, the shielding film 2 may include an antireflection film in the surface layer region (upper layer region) thereof. In this case, the antireflective layer may be composed of an oxygen-containing material, and preferable examples thereof include CrOH, CrCOH, CrNOH, CrCH, and CrCONH. The antireflective layer limits the reflectance at the exposure wavelength to, for example, 20% or less, preferably 15% or less, which prevents multiple reflection between the shielding film and the exposed surface during transfer of the mask pattern to the receiving medium, and thus prevents the deterioration of the imaging properties. In addition, the reflectance at the wavelengths used for the defect inspection on a photomask blank or a photomask (for example, 257 nm, 364 nm, and 488 nm) is preferably limited to, for example, 30% or less to improve the accuracy in defect inspection. It is particularly preferable that the antireflective layer contain carbon to reduce the reflectance at the above-described exposure wavelengths and limit the reflectance at the inspection wavelength (particularly 257 nm) to 20% or less. More specifically, the carbon content is preferably from 5 to 20 at %. If the carbon content is less than 5 at %, the effect for reducing the reflectance at the above-described wavelengths is insufficient, and if the carbon content exceeds 20 at %, the dry etching rate decreases, the dry etching time necessary for patterning the shielding film by dry etching increases, which hinders the reduction of the thickness of the resist film. The antireflective layer containing carbon prevents static buildup on the shielding film during electron beam pattern drawing on the shielding film for forming a resist pattern. Even if the thickness of the antireflective layer containing carbon is decreased, there is no problem because the shielding film of the present invention maintains its electrical conductivity and provides a higher dry etching rate due to the hydrogen contained therein. From the viewpoint of improving the sectional shape of the pattern of the shielding film patterned by dry etching, the dry etching rate of the shielding film is preferably 2.5 Å/second or more, and more preferably 3 Å/second or more. In addition, the shielding film 2 is preferably composed of a material having a selectivity of more than 1 to the resist film such that the resist film remains regardless of the shrinkage of the resist pattern as of the completion of patterning of the shielding film by dry etching using the resist pattern formed thereon as a mask. The selectivity is expressed by the ratio between the shrinkage of the resist film and the shrinkage of the shielding film after the dry etching treatment (shrinkage of shielding film/shrinkage of resist film). From the viewpoint of preventing the deterioration of the sectional shape of the shielding film pattern and the occurrence of the global loading phenomenon, the selectivity of the shielding film to the resist film is preferably more than 1 and 10 or less, and more preferably more than 1 and 5 or less.

The antireflective layer may be provided in the translucent substrate side as necessary.

The hydrogen content in the shielding film 2 may vary along the depth direction. The shielding film 2 may be a graded composition film wherein the hydrogen content continuously or gradually varies in the antireflective layer in the surface layer region and the other layer (shielding layer). In this case, the dry etching rate may be decreased along the depth direction of the shielding film by, as described above, increasing the hydrogen content in the antireflective layer on the shielding film 2 thereby increasing the electrical conductivity of the shielding film, or by decreasing the hydrogen content along the depth direction. In this case, line width errors caused by the global loading phenomenon during dry etching are reduced. Alternatively, the shielding film 2 may be a graded composition film wherein the hydrogen content decreases in a region in the depth direction. Alternatively, the shielding film 2 may be a graded composition film containing chromium, hydrogen, and other element such as nitrogen, oxygen, or carbon, wherein the contents of these elements vary along the depth direction of the shielding film, and the composition continuously or gradually varies along the depth direction. Examples of the method for making such a graded composition film as the shielding film include the above-described method of changing the type (composition) of the sputtering gas during sputtering film formation, and a method of changing the pressure of the sputtering gas during film formation.

The shielding film 2 has a thickness to give an optical density of 2.5 or more upon exposure. More specifically, the thickness of the shielding film 2 is preferably 90 mm or less. This is due to the recent miniaturization of patterns at a submicron level. If the film thickness exceeds 90 nm, the microloading phenomenon on the pattern during dry etching may hinder the formation of a fine pattern. Through the appropriate reduction of the film thickness, the aspect ratio of the pattern (the ratio of pattern depth to pattern width) is reduced, and line width errors caused by the global loading phenomenon and microloading phenomenon are reduced. In addition, the appropriate reduction of the film thickness allows the prevention of damages to a pattern (for example, collapse) at, in particular, a submicron level. In the present invention, even if the shielding film is a thin film having a thickness of 90 nm or less, it gives an intended optical density (for example, 2.5 or more) at an exposure wavelength of 200 nm or less. The thickness of the shielding film 2 may be reduced as much as possible as long as it gives an intended optical density.

The method for forming the shielding film 2 is not particularly limited, but is preferably a sputtering film formation method. The sputtering film formation method forms a thin film having a uniform thickness, so that is suitable for the present invention. When the shielding film 2 is formed on the translucent substrate 1 by the sputtering film formation method, the sputtering target is a chromium (Cr) target, and the sputtering gas introduced into the chamber is a mixed gas containing an inert gas such as an argon gas or a helium gas, a hydrocarbon gas, a hydrogen gas, and as necessary other gas such as an oxygen gas, a nitrogen gas, a nitric oxide gas, a dinitrogen monoxide gas, a carbon monoxide gas, or a carbon dioxide gas.

A sputtering gas composed of a hydrogen gas and an inert gas such as an argon gas forms a shielding film containing chromium and hydrogen, and a sputtering gas composed of a hydrocarbon gas and an inert gas such as an argon gas forms a shielding film containing chromium and carbon, or a shielding film containing chromium, hydrogen, and carbon. Alternatively, a sputtering gas composed of an oxygen gas and an inert gas such as an argon gas forms a shielding film containing chromium and oxygen, and a sputtering gas composed of a nitrogen gas and an inert gas such as argon gas forms a shielding film containing chromium and nitrogen. Alternatively, a sputtering gas composed of an inert gas such as argon gas and a mixture of an oxygen gas and a nitrogen gas, a nitric oxide gas, or a dinitrogen monoxide gas forms a shielding film containing chromium, oxygen, and nitrogen.

The hydrogen content in the shielding film 2 may be adjusted by the flow rates of the hydrogen gas and hydrocarbon gas, the type of the hydrocarbon gas, the pressure of the sputtering gas, and other conditions.

The photomask blank may have a structure as shown in FIG. 2(a), wherein a shielding film 2 has thereon a resist film 3. The thickness of the resist film 3 is preferably as thin as possible to improve the pattern accuracy (CD accuracy) of the shielding film. Specifically, when the photomask blank is a photomask blank for so-called binary masking as exemplified by the first embodiment, the thickness of the resist film 3 is preferably 300 nm or less, more preferably 200 mm or less, and even more preferably 150 nm or less. The lower limit of the thickness of the resist film is set at a certain value such that the resist film remains after dry etching of the shielding film using the resist pattern as a mask. In consideration of the above facts, the thickness of the resist film is preferably from 10 nm to 300 nm, more preferably from 15 nm to 200 nm, and even more preferably from 20 nm to 150 nm. In order to achieve a high resolution, the material of the resist film 3 is preferably a chemically amplified resist having a high resist sensitivity. The resist is particularly suitable for a photomask blank used for the production of a photomask wherein the resist film is subjected to electron beam drawing at 50 keV or more to form a resist pattern, and the shielding film is etched using the resist pattern as a mask.

The method for producing a photomask using the photomask blank 10 shown in FIG. 1 is described below.

The method for producing a photomask using the photomask blank 10 includes a step of patterning the shielding film 2 of the photomask blank 10 by dry etching, and specifically includes steps of subjecting the resist film formed on the photomask blank 10 to intended pattern exposure (pattern drawing), developing the resist film according to the intended pattern exposure thereby forming a resist pattern, etching the shielding film along the resist pattern, and removing the residual portions of the resist pattern.

FIG. 2 shows cross sectional views sequentially representing the production process for the photomask using the photomask blank 10.

FIG. 2(a) shows the step of forming the resist film 3 on the shielding film 2 of the photomask blank 10 shown in FIG. 1. The resist material of the may be a positive or negative resist material.

FIG. 2(b) shows the step of subjecting the resist film 3 formed on the photomask blank 10 to intended pattern exposure (pattern drawing). The pattern exposure is carried out using, for example, an electron beam drawing apparatus. The resist material has photosensitivity to an electron beam or laser beam. Since the shielding film 2 is conductive, it prevents static buildup during the electron beam drawing.

FIG. 2(c) shows the step of developing the resist film 3 according to the intended pattern exposure thereby forming a resist pattern 3a. In this step, a developing solution is fed to the resist film 3 formed on the photomask blank 10 after the intended pattern exposure, thereby dissolving the portions of the resist film soluble in the developing solution to form the resist pattern 3a.

FIG. 2(d) shows the step of etching the shielding film 2 along the resist pattern 3a. The photomask blank of the present invention is suitable for dry etching, so that the etching step is preferably carried out by dry etching. In the etching step, the exposed areas on the shielding film 2 having no resist pattern 3a are removed by dry etching using the resist pattern 3a as a mask, whereby an intended shielding film pattern 2a (mask pattern) is formed on the translucent substrate 1.

In the present invention, the dry etching preferably uses a dry etching gas composed of a chlorine-based gas, or a mixed gas composed of a chlorine-based gas and an oxygen gas. In the present invention, when the shielding film 2 composed of chromium and other elements such as hydrogen, oxygen, and nitrogen is dry-etched using the above-described dry etching gas, the dry etching rate increases and the etching time decreases, which allow the formation of a shielding film pattern having a good sectional shape. Examples of the chlorine-based gas used as the dry etching gas include $Cl_2$, $SiCl_4$, HCl, $CCl_4$, and $CHCl_3$.

When the shielding film is composed chromium and other element including at least oxygen, chromyl chloride is generated by the reaction between the oxygen, chromium, and chlorine-based gas contained in the shielding film. Therefore, when a dry etching gas containing a chlorine-based gas and an oxygen gas is used for dry etching, the oxygen content in the dry etching gas may be reduced according to the oxygen content in the shielding film. The use of the dry etching gas containing less oxygen reduces the adverse effect of oxygen on the resist pattern, and prevents damages to the resist pattern during dry etching, which allows the production of a photomask having a shielding film with an improved pattern accuracy. According to the oxygen content in the shielding film, an oxygen-free dry etching gas may be used.

FIG. 2(e) shows a photomask 20 obtained by removing the residual portions of the resist pattern 3a. Thus, a photomask having an accurate shielding film pattern with a good sectional shape is produced.

The present invention is not limited to the above-described embodiments. More specifically, the photomask blank is not necessarily a photomask blank for so-called binary masking composed of a translucent substrate having thereon a shielding film, and may be, for example, a photomask blank used for producing a halftone phase shift mask. In this case, as exemplified by the second embodiment, a shielding film is formed on a halftone phase shifter film on a translucent substrate. The intended optical density (for example, 2.5 or more) may be achieved by the total optical density of the halftone phase shifter film and the shielding film, so that the optical density of the shielding film may be, for example, less than 2.5.

Second Embodiment

A second embodiment of the photomask blank of the present invention is described with reference to FIG. 3(a).

The photomask blank 30 shown in FIG. 3(a) includes a translucent substrate 1, a halftone phase shifter film 4 on the translucent substrate 1, and a shielding film 2 composed of a shielding layer 5 and an antireflective layer 6 on the halftone phase shifter film 4. The translucent substrate 1 and the shielding film 2 are described in the first embodiment, and therefore explanations thereof are omitted.

The halftone phase shifter film 4 is pervious to light having an intensity which will not substantially contribute to the exposure (for example, from 1% to 30% with reference to the exposure wavelength), and has a specific phase difference. The halftone phase shifter film 4 is composed of semitranslucent areas having the patterned halftone phase shifter film 4, and translucent areas having no halftone phase shifter film 4 and being pervious to light having an intensity which will substantially contribute to the exposure. The phase of rays passing through the semitranslucent areas is in a substantially inverse relationship with the phase of rays passing through the translucent areas, so that the rays passing through the neighborhood of the boundaries between the semitranslucent areas and the translucent areas and entering into respective areas by the diffraction phenomenon are canceled out each other, whereby the optical intensity at the boundaries is almost nulled, and the contrast, more specifically the resolution at the boundaries is improved.

The halftone phase shifter film 4 is preferably composed of a material whose etching properties are different from those of the shielding film 2 formed thereon. The halftone phase shifter film 4 may be composed, for example, a material composed mainly of a metal such as molybdenum, tungsten, tantalum, or hafnium, silicon, oxygen, and/or nitrogen. The halftone phase shifter film 4 may be monolayer or multilayer.

The shielding film 2 according to the second embodiment gives an optical density of 2.5 or more upon exposure in the laminated structure composed of a halftone phase shift film and a shielding film. In this case, the thickness of the shielding film 2 is preferably 50 mm or less. The reason is that, as with the first embodiment, the microloading phenomenon on the pattern during dry etching may hinder the formation of a fine pattern. In the second embodiment, the thickness of the resist film formed on the antireflective layer 6 is preferably 250 nm or less, more preferably 200 nm or less, and even more preferably 150 nm or less. The lower limit of the thickness of the resist film is set at a certain value such that the resist film remains after dry etching of the shielding film using the resist pattern as a mask. In consideration of the above facts, the thickness of the resist film is preferably from 10 nm to 300 nm, more preferably from 15 nm to 200 nm, and even more preferably from 20 nm to 150 nm. In order to achieve a high resolution, the material of the resist film is preferably a chemically amplified resist having a high resist sensitivity. The resist is particularly suitable for a photomask blank used for the production of a photomask wherein the resist film is subjected to electron beam drawing at 50 keV or more to form a resist pattern, and the shielding film is etched using the resist pattern as a mask.

Third Embodiment

The cross sectional view showing the third embodiment of the photomask blank of the present invention is the same as FIG. 1, so that the third embodiment is illustrated with reference to FIG. 1.

A photomask blank 10 is a photomask blank for binary masking, and includes a translucent substrate 1 having thereon a shielding film 2.

The photomask blank 10 is a dry etching photomask blank suitable for use with the method for producing a photomask wherein the shielding film 2 is patterned by dry etching using the resist pattern formed on the shielding film 2 as a mask.

The translucent substrate 1 is usually a glass substrate. A glass substrate has excellent flatness and smoothness, so that allows highly accurate transfer of a pattern from a photomask to a semiconductor substrate without creating distortion of the transfer pattern.

The shielding film 2 is preferably composed of a material having a selectivity of more than 1 to the resist film such that the resist film remains regardless of the shrinkage of the resist pattern as of the completion of patterning of the shielding film by dry etching using the resist pattern formed thereon as a mask. The selectivity is expressed by the ratio between the shrinkage of the resist film and the shrinkage of the shielding film after the dry etching treatment (shrinkage of shielding film/shrinkage of resist film). From the viewpoint of preventing the deterioration of the sectional shape of the shielding film pattern and the occurrence of the global loading phenomenon, the selectivity of the shielding film to the resist film is preferably more than 1 and 10 or less, and more preferably more than 1 and 5 or less.

Specific examples of the material of the shielding film 2 include materials containing chromium and an additive element which provides a higher dry etching rate than a shielding film containing chromium alone. The additive element which provides a higher dry etching rate than a shielding film containing chromium alone preferably includes oxygen and/or nitrogen.

The material of the shielding film 2 is not limited to the chromium-containing material, and may be a material containing a transition metal such as chromium, tantalum, titanium, molybdenum, or tungsten. When the shielding film 2 is multilayer, the transition metals contained in respective layers composing the shielding film 2 may be the same or different from each other.

When the shielding film 2 contains oxygen, the oxygen content is preferably from 5 to 80 at %. If the oxygen content is less than 5 at %, it is difficult to increase the dry etching rate in comparison with that for a shielding film composed of chromium alone. On the other hand, if the oxygen content exceeds 80 at %, the absorption coefficient for a wavelength of 200 nm or less, for example, an ArF excimer laser beam (wavelength: 193 nm) decreases, so that the film thickness must be increased so as to give an intended optical density (2.5 or more). The oxygen content is preferably from 10 to 50 at %.

When the shielding film 2 contains nitrogen, the nitrogen content is preferably from 15 to 80 at %. If the nitrogen content is less than 20 at %, it is difficult to increase the dry etching rate in comparison with that for a shielding film composed of chromium alone. On the other hand, if the nitrogen content exceeds 80 at %, the absorption coefficient for a wavelength of 200 nm or less, for example, an ArF excimer laser beam (wavelength: 193 nm) decreases, so that the film thickness must be increased so as to give an intended optical density (2.5 or more).

The shielding film 2 may contain both of oxygen and nitrogen. In this case, the total content of oxygen and nitrogen is preferably from 10 to 80 at %. The ratio between the oxygen content and the nitrogen content in the shielding film 2 is not particularly limited, and may be appropriately established in consideration of, for example, the absorption coefficient.

When the shielding film 2 contains carbon, the carbon content is preferably from 1 to 20 at %. Carbon increases the electrical conductivity, and reduces the reflectance. However, when the shielding film contains carbon, the dry etching rate decreases, which increases the dry etching time required for patterning of the shielding film by dry etching to hinder the reduction of the thickness of the resist film. From the above-described viewpoints, the carbon content is preferably from 1 to 20 at %, and more preferably from 3 to 15 at %.

The method for forming the shielding film 2 is not particularly limited, but is preferably a sputtering film formation method. The sputtering film formation method forms a thin film having a uniform thickness, so that is suitable for the present invention. When the shielding film 2 is formed on the translucent substrate 1 by the sputtering film formation method, the sputtering target is a chromium (Cr) target, and the sputtering gas introduced into the chamber is an inert gas such as an argon gas or a helium gas mixed with other gas such as an oxygen gas, a nitrogen gas, a carbon dioxide gas, or a nitrogen monoxide gas. A sputtering gas composed of an oxygen gas or a carbon dioxide gas and an inert gas such as an argon gas forms a shielding film containing chromium and oxygen. A sputtering gas composed of a nitrogen gas and an inert gas such as an argon gas forms a shielding film containing chromium and nitrogen. A sputtering gas composed of a nitrogen monoxide gas and an inert gas such as an argon gas forms a shielding film containing chromium, nitrogen, and oxygen. A sputtering gas composed of a methane gas and an inert gas such as an argon gas forms a shielding film containing chromium and carbon.

In the present invention, the shielding film 2 is formed in such a manner that the film formation rate of the layer at the surface side is lower than the film formation rate of the layer at the translucent substrate side of the shielding film.

When the film formation rate of the layer at the surface side of the shielding film is lower than the film formation rate of the layer at the translucent substrate side of the shielding film, the dry etching rate decreases along the depth direction of the shielding film (more specifically, from the surface side toward the translucent substrate side of the shielding film). This reduces the occurrence of the global loading phenomenon, and improves the pattern accuracy.

The point at which the formation rate of the shielding film is changed is appropriately established such that the dry etching rate of the shielding film along the depth direction is favorably controlled as described above. For example, the formation rate of the shielding film may be changed by changing the composition of the shielding film through the change of the type (composition) of the sputtering gas during formation of the shielding film. The dry etching rate of the shielding film is varied by the material of the shielding film. Therefore, when the shielding film is a graded composition film wherein the composition varies along the depth direction, the film formation rate is changed at a point established in consideration of the variation of the dry etching rate by the graded composition. The dry etching rate may be changed gradually or continuously along the depth direction of the shielding film.

The most convenient method for changing the formation rate of the shielding film is, for example, a method of changing the power (sputtering power) and sputtering power density of the film formation apparatus. Usually, the film formation rate increases as the increase of the power (sputtering power) and the sputtering power density of the film formation apparatus, and decreases as the decrease of the power (sputtering power) and the sputtering power density. In this case, the power (sputtering power) and the sputtering power density of the film formation apparatus are appropriately adjusted such that the dry etching rate favorably decreases along the depth direction of the shielding film. The method for changing the film formation rate is not limited to the above method, and may be, for example, other method wherein the film formation rate is changed through the change of the gas pressure during film formation.

The shielding film 2 has a thickness to give an optical density of 2.5 or more upon exposure. More specifically, the thickness of the shielding film 2 is preferably 90 nm or less. This is due to the recent miniaturization of patterns at a submicron level. If the film thickness exceeds 90 nm, the microloading phenomenon on the pattern during dry etching may hinder the formation of a fine pattern. Through the appropriate reduction of the film thickness, the aspect ratio of the pattern (the ratio of pattern depth to pattern width) is reduced, and line width errors caused by the global loading phenomenon and microloading phenomenon are reduced. In addition, the appropriate reduction of the film thickness allows the prevention of damages to a pattern (for example, collapse) at, in particular, a submicron level. In the present invention, even if the shielding film is a thin film having a thickness of 90 nm or less, it gives an intended optical density (for example, 2.5 or more) at an exposure wavelength of 200 nm or less. The thickness of the shielding film 2 may be reduced as much as possible as long as it gives an intended optical density.

The shielding film 2 may be monolayer or multilayer. It is preferable that oxygen and/or nitrogen be contained in all the layers. For example, the shielding film 2 may include an antireflective layer in the surface layer region (upper layer region). In this case, examples of the preferable material of the antireflective layer include $CrO$, $CrCO_3$, $CrNO_3$, and $CrCON$. The antireflective layer limits the reflectance at the exposure wavelength to, for example, 20% or less, preferably 15% or less, which prevents multiple reflection between the shielding film and the exposed surface during transfer of the mask pattern to the receiving medium, and thus prevents the deterioration of the imaging properties. In addition, the reflectance at the wavelengths used for the defect inspection on photomask blanks and photomasks (for example, 257 nm, 364 nm, and 488 nm) is preferably limited to, for example, 30% or less to improve the accuracy in defect inspection. It is particularly preferable that the antireflective layer contain carbon to reduce the reflectance at the above-described exposure wavelengths and limit the reflectance at the inspection wavelength (particularly 257 nm) to 20% or less. More specifically, the carbon content is preferably from 5 to 20 at %. If the carbon content is less than 5 at %, the effect for reducing the reflectance at the above-described wavelengths is insufficient, and if the carbon content exceeds 20 at %, the dry etching rate decreases, the dry etching time necessary for patterning the shielding film by dry etching increases, which hinders the reduction of the thickness of the resist film.

When an antireflective film such as a CrO film is formed by reactive sputtering in an atmosphere of oxygen-containing gas, film defects increase as the increase of the film formation rate through the increase of the power of the film formation apparatus. Therefore, the film formation rate is preferably lower for reducing film defects. The antireflective layer may be provided in the translucent substrate side as necessary. The shielding film 2 may be a graded composition film wherein the contents of chromium and other element such as nitrogen, oxygen, or carbon vary in the antireflective layer in the surface layer region and the other layer (shielding layer). The method for making such a graded composition film as the shielding film is preferably the above-described method wherein the type (composition) of the sputtering gas is changed during sputtering film formation.

The photomask blank may have a structure as shown in FIG. 2(a), wherein the shielding film 2 has thereon the resist film 3. The thickness of the resist film 3 is preferably as thin as possible to improve the pattern accuracy (CD accuracy) of the shielding film. Specifically, when the photomask blank is a photomask blank for so-called binary masking as exemplified by the third embodiment, the thickness of the resist film 3 is preferably 300 nm or less, more preferably 200 mm or less, and even more preferably 150 nm or less. The lower limit of the thickness of the resist film is set at a certain value such that the resist film remains after dry etching of the shielding film using the resist pattern as a mask. In consideration of the above facts, the thickness of the resist film is preferably from 10 nm to 300 nm, more preferably from 15 nm to 200 nm, and even more preferably from 20 nm to 150 nm. In order to achieve a high resolution, the material of the resist film 3 is preferably a chemically amplified resist having a high resist sensitivity. The resist is particularly suitable for a photomask blank used for the production of a photomask wherein the resist film is subjected to electron beam drawing at 50 keV or more to form a resist pattern, and the shielding film is etched using the resist pattern as a mask.

The method for producing a photomask using the photomask blank 10 according to an embodiment of the invention includes a step of patterning the shielding film 2 on the photomask blank 10 by dry etching, and specifically includes steps of subjecting the resist film formed on the photomask blank 10 to intended pattern exposure (pattern drawing), developing the resist film according to the intended pattern exposure thereby forming a resist pattern, etching the shielding film along the resist pattern, and removing the residual portions of the resist pattern. The photomask is produced in the same production process shown in FIG. 2 wherein a photomask is produced using the photomask blank 10. Thus, a photomask having an accurate shielding film pattern with a good sectional shape is produced.

The present invention is not limited to the above-described embodiments. More specifically, the photomask blank is not limited to a photomask blank for so-called binary masking wherein a shielding film is formed on a translucent substrate, and may be, for example, a photomask blank used for producing a halftone phase shift mask. In this case, as exemplified by the fourth embodiment, a shielding film is formed on a halftone phase shifter film on a translucent substrate. The intended optical density (for example, 2.5 or more) may be achieved by the total optical density of the halftone phase shifter film and the shielding film, so that the optical density of the shielding film may be, for example, less than 2.5.

Fourth Embodiment

The fourth embodiment of the photomask blank of the present invention is described below. The cross sectional view showing the fourth embodiment of the photomask blank of the present invention is the same as FIG. 3(a) (the second embodiment), so that the third embodiment is illustrated with reference to FIG. 3(a).

The photomask blank 30 shown in FIG. 3(a) includes a translucent substrate 1, a halftone phase shifter film 4 on the translucent substrate 1, and a shielding film 2 composed of a shielding layer 5 and an antireflective layer 6 on the halftone phase shifter film 4. The translucent substrate 1 and the shielding film 2 in the fourth embodiment are described in the third embodiment, and therefore explanations thereof are omitted.

The halftone phase shifter film 4 is, as with the second embodiment, pervious to light having an intensity which will not substantially contribute to the exposure (for example, from 1% to 30% with reference to the exposure wavelength), and has a specific phase difference.

The halftone phase shifter film 4 is preferably composed of a material whose etching properties are different from those of the shielding film 2 formed thereon. The halftone phase shifter film 4 may be composed, for example, a material composed mainly of a metal such as molybdenum, tungsten, tantalum, or hafnium, silicon, oxygen, and/or nitrogen. The halftone phase shifter film 4 may be monolayer or multilayer. The shielding film 2 according to the fourth embodiment gives an optical density of 2.5 or more upon exposure in the laminated structure composed of a halftone phase shift film and a shielding film. In this case, the thickness of the shielding film 2 is preferably 50 mm or less. The reason is that, as with the first embodiment, the microloading phenomenon on the pattern during dry etching may hinder the formation of a fine pattern. When the thickness of the shielding film 2 is 50 mm or less, line width errors caused by the global loading phenomenon and the microloading phenomenon during dry etching are further reduced. In the fourth embodiment, the thickness of the resist film formed on the antireflective layer 6 is preferably 250 nm or less, more preferably 200 nm or less, and even more preferably 150 nm or less. The lower limit of the thickness of the resist film is set at a certain value such that the resist film remains after dry etching of the shielding film using the resist pattern as a mask. In consideration of the above facts, the thickness of the resist film is preferably from 10 nm to 300 nm, more preferably from 15 nm to 200 nm, and even more preferably from 20 nm to 150 nm. As with the above-described embodiments, in order to achieve a high resolution, the material of the resist film is preferably a chemically amplified resist having a high resist sensitivity. The resist is particularly suitable for a photomask blank used for the production of a photomask wherein the resist film is subjected to electron beam drawing at 50 keV or more to form a resist pattern, and the shielding film is etched using the resist pattern as a mask.

Fifth Embodiment

The fifth embodiment of the photomask blank of the present invention is described below. The cross sectional view of the fifth embodiment is the same as FIG. 1, so that the fifth embodiment is illustrated with reference to FIG. 1.

The photomask blank 10 of the fifth embodiment is a photomask blank for binary masking, and includes a translucent substrate 1 having thereon a shielding film 2.

The photomask blank 10 is a dry etching photomask blank suitable for use with the method for producing a photomask wherein the shielding film 2 is patterned by dry etching using the resist pattern formed on the shielding film 2 as a mask.

The translucent substrate 1 is usually a glass substrate. A glass substrate has excellent flatness and smoothness, so that allows highly accurate transfer of a pattern from a photomask to a semiconductor substrate without creating distortion of the transfer pattern.

The shielding film 2 is preferably composed of a material having a selectivity of more than 1 to the resist film such that the resist film remains regardless of the shrinkage of the resist pattern as of the completion of patterning of the shielding film by dry etching using the resist pattern formed thereon as a mask. The selectivity is expressed by the ratio between the shrinkage of the resist film and the shrinkage of the shielding film after the dry etching treatment (shrinkage of shielding film/shrinkage of resist film). From the viewpoint of preventing the deterioration of the sectional shape of the shielding film pattern and the occurrence of the global loading phenomenon, the selectivity of the shielding film to the resist film is preferably more than 1 and 10 or less, and more preferably more than 1 and 5 or less.

The dry etching rate of the shielding film 2 is lower at the translucent substrate side than at the surface side. This reduces the occurrence of the global loading phenomenon, and improves the pattern accuracy and the sectional shape of the pattern. It is preferable that the dry etching rate decreases along the depth direction from the surface side toward the translucent substrate side of the shielding film 2. In order to decrease the dry etching rate along the depth direction of the shielding film, for example, it is preferable that the shielding film contain oxygen. A shielding film containing chromium and oxygen is dry-etched at a faster rate than a shielding film containing chromium alone. In addition, when the shielding film is a graded composition film wherein the oxygen content decreases along the depth direction of shielding film, the dry etching rate decreases along the depth direction of the shielding film.

Specific examples of the material of the shielding film 2 include materials containing chromium and an additive element which provides a higher dry etching rate than a shielding film containing chromium alone. The additive element which provides a higher dry etching rate than a shielding film containing chromium alone preferably includes oxygen and/or nitrogen.

The material of the shielding film 2 is not limited to the chromium-containing material, and may be a material containing a transition metal such as chromium, tantalum, titanium, molybdenum, or tungsten. When the shielding film 2 is multilayer, the transition metals contained in respective layers composing the shielding film 2 may be the same or different from each other.

When the shielding film 2 contains oxygen, the oxygen content is preferably from 5 to 80 at %. If the oxygen content is less than 5 at %, it is difficult to increase the dry etching rate in comparison with that for a shielding film composed of chromium alone. On the other hand, if the oxygen content exceeds 80 at %, the absorption coefficient for a wavelength of 200 nm or less, for example, an ArF excimer laser beam (wavelength: 193 nm) decreases, so that the film thickness must be increased so as to give an intended optical density (2.5 or more). The oxygen content is preferably from 10 to 50 at %.

It is also preferable that the shielding film 2 contain nitrogen as the additive element which provides a higher dry etching rate than a shielding film containing chromium alone. When the shielding film 2 contains nitrogen, the nitrogen content is preferably from 20 to 80 at %. If the nitrogen content is less than 20 at %, it is difficult to increase the dry etching rate in comparison with that for a shielding film composed of chromium alone. On the other hand, if the nitrogen content exceeds 80 at %, the absorption coefficient for a wavelength of 200 nm or less, for example, an ArF excimer laser beam (wavelength: 193 nm) decreases, so that the film thickness must be increased so as to give an intended optical density (2.5 or more).

The shielding film 2 may contain both of oxygen and nitrogen. In this case, the total content of oxygen and nitrogen is preferably from 10 to 80 at %. The ratio between the oxygen content and the nitrogen content in the shielding film 2 is not particularly limited, and may be appropriately established in consideration of, for example, the absorption coefficient.

When the shielding film 2 contains carbon, the carbon content is preferably from 1 to 20 at %. Carbon increases the electrical conductivity, and reduces the reflectance. However, when the shielding film contains carbon, the dry etching rate decreases, which increases the dry etching time required for patterning of the shielding film by dry etching to hinder the reduction of the thickness of the resist film. From the above-described viewpoints, the carbon content is preferably from 1 to 20 at %, and more preferably from 3 to 15 at %.

The method for forming the shielding film 2 is not particularly limited, but is preferably a sputtering film formation method. The sputtering film formation method forms a thin film having a uniform thickness, so that is suitable for the present invention. When the shielding film 2 is formed on the translucent substrate 1 by the sputtering film formation method, the sputtering target is a chromium (Cr) target, and the sputtering gas introduced into the chamber is an inert gas such as an argon gas or a helium gas mixed with other gas such as an oxygen gas, a nitrogen gas, a carbon dioxide gas, or a nitrogen monoxide gas. A sputtering gas composed of an oxygen gas or a carbon dioxide gas and an inert gas such as an argon gas forms a shielding film containing chromium and oxygen. A sputtering gas composed of a nitrogen gas and an inert gas such as an argon gas forms a shielding film containing chromium and nitrogen. A sputtering gas composed of a methane gas and an inert gas such as an argon gas forms a shielding film containing chromium and carbon.

The shielding film 2 has a thickness to give an optical density of 2.5 or more upon exposure. More specifically, the thickness of the shielding film 2 is preferably 90 nm or less. This is due to the recent miniaturization of patterns at a submicron level. If the film thickness exceeds 90 nm, the microloading phenomenon on the pattern during dry etching may hinder the formation of a fine pattern. Through the appropriate reduction of the film thickness, the aspect ratio of the pattern (the ratio of pattern depth to pattern width) is reduced, and line width errors caused by the global loading phenomenon and microloading phenomenon are reduced. In addition, the appropriate reduction of the film thickness allows the prevention of damages to a pattern (for example, collapse) at, in particular, a submicron level. In the present invention, even if the shielding film is a thin film having a thickness of 90 nm or less, it gives an intended optical density (for example, 2.5 or more) at an exposure wavelength of 200 nm or less. The thickness of the shielding film 2 may be reduced as much as possible as long as it gives an intended optical density.

The shielding film 2 may be monolayer or multilayer. It is preferable that oxygen and/or nitrogen be contained in all the layers. For example, the shielding film 2 may include an antireflective layer in the surface layer region (upper layer region). In this case, examples of the preferable material of the antireflective layer include CrO, $CrCO_3$, $CrNO_3$, and CrCON. The antireflective layer limits the reflectance at the exposure wavelength to, for example, 20% or less, preferably 15% or less, which prevents multiple reflection between the shielding film and the exposed surface during transfer of the mask pattern to the receiving medium, and thus prevents the deterioration of the imaging properties. In addition, the reflectance at the wavelengths used for the defect inspection on photomask blanks and photomasks (for example, 257 nm, 364 nm, and 488 nm) is preferably limited to, for example, 30% or less to improve the accuracy in defect inspection. It is particularly preferable that the antireflective layer contain carbon to reduce the reflectance at the above-described exposure wavelengths and limit the reflectance at the inspection wavelength (particularly 257 nm) to 20% or less. More specifically, the carbon content is preferably from 5 to 20 at %. If the carbon content is less than 5 at %, the effect for reducing the reflectance at the above-described wavelengths is insufficient, and if the carbon content exceeds 20 at %, the dry etching rate decreases, the dry etching time necessary for patterning the shielding film by dry etching increases, which hinders the reduction of the thickness of the resist film.

The antireflective layer may be provided in the translucent substrate side as necessary. The shielding film 2 may be a graded composition film wherein the contents of chromium and other element such as nitrogen, oxygen, or carbon vary in the antireflective layer in the surface layer region and the other layer (shielding layer). The method for making such a graded composition film as the shielding film is preferably the above-described method wherein the type (composition) of the sputtering gas is changed during sputtering film formation.

In order to decrease the dry etching rate of the shielding film along the depth direction, the shielding film may be, for example, a graded composition film containing wherein the oxygen content decreases along the depth direction of the shielding film, or a graded composition film containing hydrogen wherein the hydrogen content varies along the depth direction of the shielding film. Alternatively, the dry etching rate of the shielding film may be decreased by appropriately changing the formation rate of the shielding film during film formation.

The photomask blank may have a structure as shown in FIG. 2(a), wherein the shielding film 2 has thereon the resist film 3. The thickness of the resist film 3 is preferably as thin as possible to improve the pattern accuracy (CD accuracy) of the shielding film. Specifically, when the photomask blank is a photomask blank for so-called binary masking as exemplified by an embodiment of the present invention, the thickness of the resist film 3 is preferably 300 nm or less, more preferably 200 mm or less, and even more preferably 150 nm or less. The lower limit of the thickness of the resist film is set at a certain value such that the resist film remains after dry etching of the shielding film using the resist pattern as a mask. In consideration of the above facts, the thickness of the resist film is preferably from 10 nm to 300 nm, more preferably from 15 nm to 200 nm, and even more preferably from 20 nm to 150 nm. In order to achieve a high resolution, the material of the resist film 3 is preferably a chemically amplified resist having a high resist sensitivity. The resist is particularly suitable for a photomask blank used for the production of a photomask wherein the resist film is subjected to electron beam drawing at 50 keV or more to form a resist pattern, and the shielding film is etched using the resist pattern as a mask.

The method for producing a photomask using the photomask blank 10 of the fifth embodiment includes a step of patterning the shielding film 2 of the photomask blank 10 by dry etching, and specifically includes steps of subjecting the resist film formed on the photomask blank 10 to intended pattern exposure (pattern drawing), developing the resist film according to the intended pattern exposure thereby forming a resist pattern, etching the shielding film along the resist pattern, and removing the residual portions of the resist pattern. Specifically, the photomask is produced in the same manner as the production process using the photomask blank 10 shown in FIG. 2. Thus, a photomask having an accurate shielding film pattern with a good sectional shape is produced using the photomask blank 10 of the fifth embodiment.

The present invention is not limited to the above-described embodiment. More specifically, the photomask blank is not necessarily a photomask blank for so-called binary masking composed of a translucent substrate having thereon a shielding film, and may be, for example, a photomask blank used for producing a halftone phase shift mask. In this case, as exemplified by the below-described sixth embodiment, a shielding film is formed on a halftone phase shifter film on a translucent substrate. The intended optical density (for example, 2.5 or more) may be achieved by the total optical density of the halftone phase shifter film and the shielding film, so that the optical density of the shielding film may be, for example, less than 2.5.

Sixth Embodiment

The sixth embodiment of the photomask blank of the present invention is described below. The cross sectional view of the sixth embodiment is the same as FIG. 3(a) (the second embodiment), so that the sixth embodiment is illustrated with reference to FIG. 3(a).

The photomask blank 30 of the sixth embodiment includes a translucent substrate 1, a halftone phase shifter film 4 on the translucent substrate 1, and a shielding film 2 composed of a shielding layer 5 and an antireflective layer 6 on the halftone phase shifter film 4. The translucent substrate 1 and the shielding film 2 in the sixth embodiment are described in the fifth embodiment, and therefore explanations thereof are omitted.

The halftone phase shifter film 4 is, as with the above-described embodiments, pervious to light having an intensity which will not substantially contribute to the exposure (for example, from 1% to 30% with reference to the exposure wavelength), and has a specific phase difference.

The halftone phase shifter film 4 is preferably composed of a material whose etching properties are different from those of the shielding film 2 formed thereon. The halftone phase shifter film 4 may be composed, for example, a material composed mainly of a metal such as molybdenum, tungsten, tantalum, or hafnium, silicon, oxygen, and/or nitrogen. The halftone phase shifter film 4 may be monolayer or multilayer.

The shielding film 2 according to the sixth embodiment gives an optical density of 2.5 or more upon exposure in the laminated structure composed of a halftone phase shift film and a shielding film. In this case, the thickness of the shielding film 2 is preferably 50 mm or less. The reason is that, as with the first embodiment, the microloading phenomenon on the pattern during dry etching may hinder the formation of a fine pattern. In the sixth embodiment, the thickness of the resist film formed on the antireflective layer 6 is preferably 250 nm or less, more preferably 200 nm or less, and even more preferably 150 nm or less. The lower limit of the thickness of the resist film is set at a certain value such that the resist film remains after dry etching of the shielding film using the resist pattern as a mask. In consideration of the above facts, the thickness of the resist film is preferably from 10 nm to 250 nm, more preferably from 15 nm to 200 nm, and even more preferably from 20 nm to 150 nm. As with the above-described embodiments, in order to achieve a high resolution, the material of the resist film is preferably a chemically amplified resist having a high resist sensitivity. The resist is particularly suitable for a photomask blank used for the production of a photomask wherein the resist film is subjected to electron beam drawing at 50 keV or more to form a resist pattern, and the shielding film is etched using the resist pattern as a mask.

EXAMPLES

The embodiments of the present invention are further described with reference to the following examples. The following Examples 1 to 5 correspond to the first and second embodiments of the present invention. Comparative Examples are also described.

Example 1

FIG. 2 shows cross sectional views of the photomask according to Example 1 and a production process for a photomask using the photomask blank. As shown in FIG. 2(a), the photomask blank 10 of Example 1 is composed of a translucent substrate 1 having thereon a shielding film 2, wherein the shielding film is composed of a shielding layer and an antireflective layer.

The photomask blank 10 is produced by the method as described below.

A shielding layer was formed on a translucent substrate 1 by reactive sputtering in an atmosphere of a mixed gas composed of an argon gas, a nitrogen gas, and a helium gas (Ar: 30% by volume, $N_2$: 30% by volume, He: 40% by volume) using an in-line type sputtering apparatus, and a chromium target as the sputtering target. Subsequently, an antireflective layer was formed by reactive sputtering in an atmosphere of a mixed gas composed of an argon gas, a methane gas, and a helium gas (Ar: 54% by volume, $CH_4$: 6% by volume, He: 40% by volume), followed by reactive sputtering in an atmosphere of a mixed gas composed of an argon gas and a nitric oxide gas (Ar: 90% by volume, NO: 10% by volume). Thus, a shielding film 2 was formed on the translucent substrate 1 composed of synthetic quartz glass. The shielding film was formed under the following conditions. The power of the sputtering apparatus and the total gas pressure during the formation of the shielding layer film were 1.16 kW, and 0.17 pascals (Pa), respectively. The power of the sputtering apparatus and the total gas pressure during the formation of the antireflective layer film power were 0.33 kW and 0.28 pascals (Pa), respectively. The thickness of the shielding film was 67 nm. The composition of the shielding film was analyzed by Rutherford back scattering, and the result indicates that the film was a chromium (Cr) film containing 32.5 at % nitrogen (N), 12.8 at % oxygen (O), and 5.9 at % hydrogen (H). The composition was also analyzed by Auger electron spectroscopy, and the result indicates that the shielding film contained 8.0 at % carbon (C).

Figure 5:
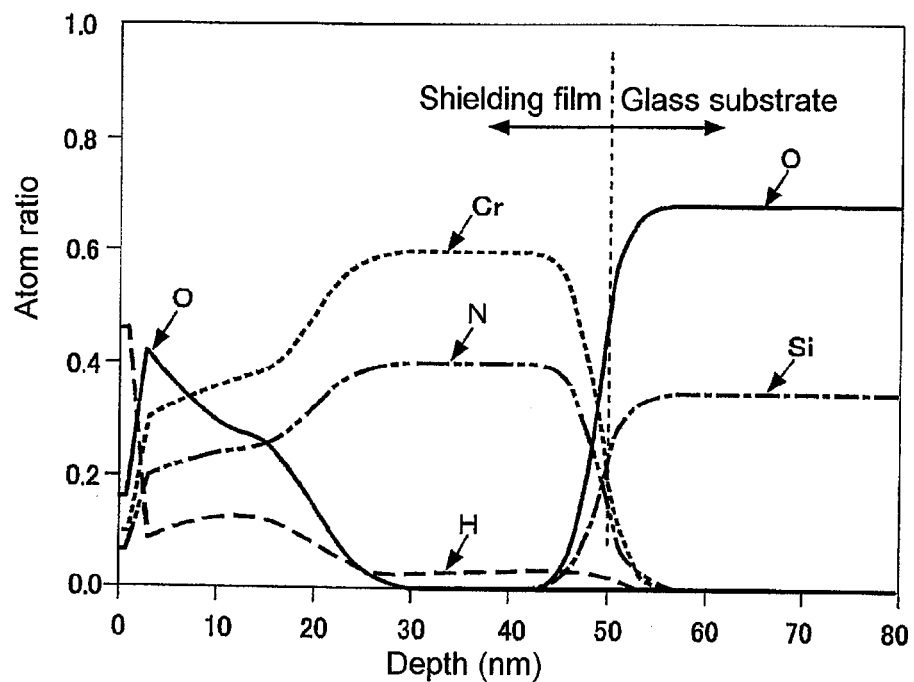
FIG. 5 is a graph showing the result of Rutherford back scattering analysis of the shielding film of Example 1.

FIG. 5 is a graph showing the result of the composition analysis along the depth direction of the shielding film of Example 1 by Rutherford back scattering analysis.

The result indicates that the shielding layer composing the shielding film was a graded composition film containing chromium and nitrogen, in addition, certain amounts of oxygen and carbon used for the formation of the antireflective layer. The antireflective layer was a graded composition film containing chromium, nitrogen, oxygen, and a certain amount of carbon. The shielding film contained hydrogen in all over the section along the depth direction. The hydrogen content was higher in the antireflective layer on the surface side. In the whole film, the hydrogen content decreased along the depth direction of the shielding film.

The shielding film gave an optical density of 3.0 at an exposure wavelength of 193 nm. The reflectance of the shielding film at the exposure wavelength of 193 nm was as low as 14.8%. The reflectances at the wavelengths of 257 nm and 364 nm used for the defect inspection of the photomask were 19.9% and 19.7%, respectively. These reflectances presented no problem for the inspection.

The sheet resistance of the shielding film was as small as 100Ω/□ as measured by a four-terminal method.

Thereafter, a chemically amplified resist film for electron beam drawing (FEP171, manufactured by Fujifilm Arch Co., Ltd., film thickness: 250 nm) was formed on the photomask blank 10. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film 3 formed on the photomask blank 10 using an electron beam drawing apparatus, and then the resist film 3 was developed with a predetermined developing solution to form a resist pattern 3a (see FIGS. 2(b) and 2(c)).

Subsequently, the shielding film 2 composed of the shielding layer and the antireflective layer was dry-etched along the resist pattern 3a to form a shielding film pattern 2a (see FIG. 2(d)). The dry etching gas was a mixed gas composed of a chlorine ($Cl_2$) gas and an oxygen ($O_2$) gas ($Cl_2$:$O_2$=4:1). The etching rate was 3.6 Å/second, which is a very fast etching rate.

In this Example, hydrogen was contained in all over the shielding film 2 to increase the etching rate. In addition, the shielding layer and the antireflective layer were composed mainly of nitrogen and oxygen, respectively, to increase the etching rate of the whole shielding film 2. Thus, the shielding film 2 had a small thickness and provided a high etching rate and a short etching time, so that the sectional shape of the shielding film pattern 2a was favorably vertical. The resist film remained on the shielding film pattern 2a.

Finally, residual portions of the resist pattern were removed, and thus a photomask 20 was obtained (see FIG. 2(e)). In this way, a photomask including a translucent substrate having thereon a shielding film pattern of 80 nm lines and spaces was produced.

Example 2

A shielding layer was formed on a translucent substrate 1 by reactive sputtering in an atmosphere of a mixed gas composed of an argon gas, a nitrogen gas, and a helium gas (Ar: 30% by volume, $N_2$: 30% by volume, He: 40% by volume) using an in-line type sputtering apparatus, and a chromium target as the sputtering target. Subsequently, an antireflective layer was formed by reactive sputtering in an atmosphere of a mixed gas composed of an argon gas, a propane gas, and a helium gas (Ar: 57% by volume, $C_3H_8$: 3% by volume, He: 40% by volume), followed by reactive sputtering in an atmosphere of a mixed gas composed of an argon gas and a nitric oxide gas (Ar: 90% by volume, NO: 10% by volume). Thus, a shielding film 2 was formed on the translucent substrate 1 composed of synthetic quartz glass. The shielding film was formed under the following conditions. The power of the sputtering apparatus and the total gas pressure during the formation of the shielding layer film were 1.14 kW, and 0.17 pascals (Pa), respectively. The power of the sputtering apparatus and the total gas pressure during the formation of the antireflective layer film power were 0.33 kW and 0.30 pascals (Pa), respectively. The thickness of the shielding film was 67 nm. The composition of the shielding film was analyzed by Rutherford back scattering, and the result indicates that the film was a chromium (Cr) film containing 30.2 at % nitrogen (N), 12.0 at % oxygen (O), and 1.8 at % hydrogen (H). The composition was also analyzed by Auger electron spectroscopy, and the result indicates that the shielding film contained 10.1 at % carbon (C).

The shielding film gave an optical density of 3.0 at an exposure wavelength of 193 nm. The reflectance of the shielding film at the exposure wavelength of 193 nm was as low as 13.5%. The reflectances at the wavelengths of 257 nm and 364 nm used for the defect inspection of the photomask were 19.8% and 20.1%, respectively. These reflectances presented no problem for the inspection.

The sheet resistance of the shielding film was as small as 110Ω/□ as measured by a four-terminal method.

Thereafter, a chemically amplified resist film for electron beam drawing (FEP171, manufactured by Fujifilm Arch Co., Ltd., film thickness: 250 nm) was formed on the photomask blank. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film formed on the photomask blank using an electron beam drawing apparatus, and then the resist film was developed with a predetermined developing solution to form a resist pattern.

Subsequently, the shielding film 2 composed of the shielding layer and the antireflective layer was dry-etched along the resist pattern to form a shielding film pattern 2a. The dry etching gas was a mixed gas composed of a chlorine ($Cl_2$) gas and an oxygen ($O_2$) gas ($Cl_2:O_2=4:1$). The etching rate was 3.3 Å/second, which is a very fast etching rate.

In Example 2, hydrogen was contained in all over the shielding film 2 to increase the etching rate. In addition, the shielding layer and the antireflective layer were composed mainly of nitrogen and oxygen, respectively, to increase the etching rate of the whole shielding film 2. Thus, the shielding film 2 had a small thickness and provided a high etching rate and a short etching time, so that the sectional shape of the shielding film pattern 2a was favorably vertical. The resist film remained on the shielding film pattern 2a.

Finally, residual portions of the resist pattern were removed, and thus a photomask was obtained. In this way, a photomask including a translucent substrate having thereon a shielding film pattern of 80 nm lines and spaces was produced.

Example 3

A shielding layer was formed on a translucent substrate 1 by reactive sputtering in an atmosphere of a mixed gas composed of an argon gas, a nitrogen gas, and a helium gas (Ar: 30% by volume, $N_2$: 30% by volume, He: 40% by volume) using an in-line type sputtering apparatus, and a chromium target as the sputtering target. Subsequently, an antireflective layer was formed by reactive sputtering in an atmosphere of a mixed gas composed of an argon gas, a methane gas, a helium gas, and a hydrogen gas (Ar: 44% by volume, $CH_4$: 6% by volume, He: 40% by volume, and $H_2$: 10% by volume), followed by reactive sputtering in an atmosphere of a mixed gas composed of an argon gas and a nitric oxide gas (Ar: 90% by volume, NO: 10% by volume). Thus, a shielding film 2 was formed on the translucent substrate 1 composed of synthetic quartz glass. The shielding film was formed under the following conditions. The power of the sputtering apparatus and the total gas pressure during the formation of the shielding layer film were 1.18 kW, and 0.17 pascals (Pa), respectively. The power of the sputtering apparatus and the total gas pressure during the formation of the antireflective layer film power were 0.33 kW and 0.26 pascals (Pa), respectively. The thickness of the shielding film was 67 nm. The composition of the shielding film was analyzed by Rutherford back scattering, and the result indicates that the film was a chromium (Cr) film containing 35.3 at % nitrogen (N), 13.0 at % oxygen (O), and 8.9 at % hydrogen (H). The composition was also analyzed by Auger electron spectroscopy, and the result indicates that the shielding film contained 4.0 at % carbon (C). The shielding film gave an optical density of 3.0 at an exposure wavelength of 193 nm. The reflectance of the shielding film at the exposure wavelength of 193 nm was as low as 15.0%. The reflectances at the wavelengths of 257 nm and 364 nm used for the defect inspection of the photomask were 18.2% and 18.5%, respectively. These reflectances presented no problem for the inspection.

The sheet resistance of the shielding film was as small as 95Ω/□ as measured by a four-terminal method.

Thereafter, a chemically amplified resist film for electron beam drawing (FEP171, manufactured by Fujifilm Arch Co., Ltd., film thickness: 250 nm) was formed on the photomask blank. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film formed on the photomask blank using an electron beam drawing apparatus, and then the resist film was developed with a predetermined developing solution to form a resist pattern.

Subsequently, the shielding film 2 composed of the shielding layer and the antireflective layer was dry-etched along the resist pattern to form a shielding film pattern 2a. The dry etching gas was a mixed gas composed of a chlorine ($Cl_2$) gas and an oxygen ($O_2$) gas ($Cl_2:O_2=4:1$). The etching rate was 4.1 Å/second, which is a very fast etching rate.

In Example 3, hydrogen was contained in all over the shielding film 2 to increase the etching rate. In addition, the shielding layer and the antireflective layer were composed mainly of nitrogen and oxygen, respectively, to increase the etching rate of the whole shielding film 2. Thus, the shielding film 2 had a small thickness and provided a high etching rate and a short etching time, so that the sectional shape of the shielding film pattern 2a was favorably vertical. The resist film remained on the shielding film pattern 2a. Finally, residual portions of the resist pattern were removed, and thus a photomask was obtained. In this way, a photomask including a translucent substrate having thereon a shielding film pattern of 80 nm lines and spaces was produced.

Example 4

Figure 3:
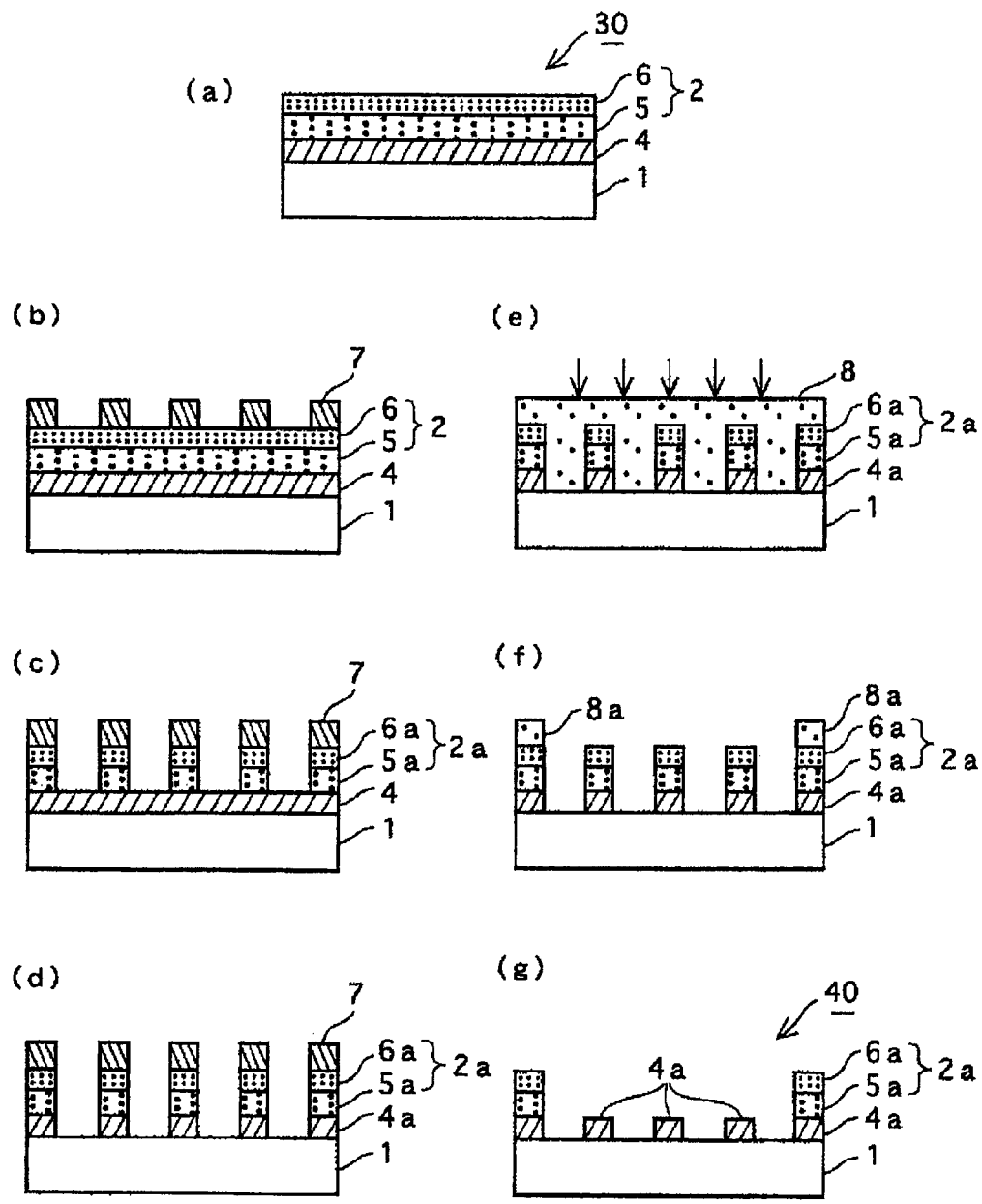
FIG. 3 shows cross sectional views of a photomask according to another embodiment of the present invention and a production process for a photomask using the photomask blank.

FIG. 3 shows cross sectional views of the photomask according to Example 4 and a production process for a photomask using the photomask blank. As shown in FIG. 3(a), the photomask blank 30 of Example 4 is composed of a translucent substrate 1, a halftone phase shifter film 4 on the translucent substrate 1, and a shielding film 2 on the halftone phase shifter film 4, wherein the shielding film 2 is composed of a shielding layer 5 and an antireflective layer 6.

The photomask blank 30 is produced by the method as described below.

A halftone phase shifter film for ArF excimer laser (wavelength: 193 nm) which is a single layer composed mainly of molybdenum, silicon, and nitrogen and has a thickness of 69 nm was formed on a translucent substrate composed of synthetic quartz glass by reactive sputtering (DC sputtering) in an atmosphere of a mixed gas composed of an argon gas (Ar) and a nitrogen gas ($Ar:N_2=10:90\%$ by volume) using a single wafer sputtering apparatus and a mixed target composed of molybdenum (Mo) and silicon (Si) (Mo:Si=8:92 mol %) as the sputtering target. The halftone phase shifter film gives a transmittance of 5.5% and a phase shift of about 180° to an ArF excimer laser (wavelength: 193 nm).

Thereafter, a shielding film having a total thickness of 48 nm and including a shielding layer and an antireflective layer was formed on the halftone phase shifter film in the same manner as Example 1.

Subsequently, a chemically amplified resist film for electron beam drawing (FEP171, manufactured by Fujifilm Arch Co., Ltd., film thickness: 200 nm) was formed on the photomask blank 30. The resist film was formed by rotary coating using a spinner (rotary coating apparatus). The coating of the resist film was subjected to predetermined heat-drying treatment using a heat dryer.

Subsequently, an intended pattern (a pattern of 70 nm lines and spaces) was drawn on the resist film formed on the photomask blank 30 using an electron beam drawing apparatus, and then the resist film was developed with a predetermined developing solution to form a resist pattern 7 (see FIG. 3(b)).

Subsequently, the shielding film 2 composed of the shielding layer 5 and the antireflective layer 6 was dry-etched along the resist pattern 7 to form a shielding film pattern 2a (see FIG. 3(c)).

Subsequently, the halftone phase shifter film 4 was etched using the shielding film pattern 2a and the resist pattern 7 as a masks to form a halftone phase shifter film pattern 4a (see FIG. 3(d)). The sectional shape of the shielding film pattern 2a influences the etching of the halftone phase shifter film 4. The shielding film pattern 2a had a good sectional shape, so that the halftone phase shifter film pattern 4a also had a good sectional shape.

Subsequently, after removing residual portions of the resist pattern 7, the resist film 8 was applied again, and subjected to pattern exposure thereby removing unnecessary portions of the shielding film pattern in the transfer areas. Thereafter, the resist film 8 was developed to form a resist pattern 8a (see FIGS. 3(e) and 3(f)). Subsequently, unnecessary portions of the shielding film pattern were removed by wet etching, residual portions of the resist pattern were removed, and thus a photomask 40 was obtained (see FIG. 3(g)). Thus, a photomask composed of a translucent substrate having thereon a halftone phase shifter film pattern of 70 nm lines and spaces was produced.

In the embodiment shown in FIG. 3(g), a shielding film is formed on the phase shifter film in the boundary areas except for the transfer areas (mask pattern formation areas). The shielding film prevents exposure light from passing through the boundary areas. The phase shift mask is used as a mask for a reducing projection exposure apparatus (stepper). When a pattern is transferred using the reducing projection exposure apparatus, the transfer areas of the phase shift mask are exclusively exposed with the boundary areas covered with the covering member (aperture) of the exposure apparatus. However, it is difficult to accurately dispose the covering member in such a manner that the transfer areas are exclusively exposed. In many cases, the exposed areas extend to the non-transfer areas around the transfer areas. Usually, a shielding film is provided in the non-transfer areas on the mask to block the stray exposure light. In a halftone phase shift mask, a phase shifter film has a shielding function, but the phase shifter film does not completely block exposure light, but transmits a very small amount of exposure light, though it will not substantially contribute a single exposure. Therefore, if exposure light strays during the repetition step, the exposure light may pass through the phase shifter film and reach the areas which have already been subjected to pattern exposure to cause multiple exposure, or the areas which have been slightly exposed to the stray light may be exposed again in another run. Through the multiple exposure, light is accumulated to contribute exposure, which may result in a defect. The problem is solved by the shielding film formed on the phase shifter film in the boundary areas excluding the mask pattern formation areas. In addition, the shielding film facilitates the recognition of reference numerals and the like attached to the boundary areas on the mask for identification.

Example 5

A TaHf film having a thickness of 75 Å was formed on a translucent substrate composed of the same synthetic quartz glass as Example 4 by DC magnetron sputtering in an atmosphere of an argon (Ar) gas using a single wafer sputtering apparatus, and a mixed target (Ta:Hf=90:10 at %) composed of tantalum (Ta) and hafnium (Hf) as the sputtering target. Subsequently, a SiON film (Si:O:N=40:27:33 at %) having a thickness of 75 Å was formed by reactive sputtering in an atmosphere of a mixed gas composed of argon, oxygen, and nitrogen using an Si target. More specifically, a two-layer halftone phase shifter film for ArF excimer laser (wavelength: 193 nm) including the TaHf film as the lower layer and the SiON film as the upper layer was formed. The halftone phase shifter film gave a transmittance of as high as 15.0% and a phase shift of about 180° to an ArF excimer laser (wavelength: 193 nm).

Thereafter, a shielding film having a total thickness of 48 nm and including a shielding layer and an antireflective layer was formed on the halftone phase shifter film in the same manner as Example 4.

Using the photomask blank for halftone phase shift mask, a halftone phase shift mask was produced in the same manner as Example 4. In Example 5, as shown in FIG. 4, the shielding film was formed in the areas excluding the boundaries of the translucent portions (the areas where no mask pattern is formed and the transparent substrate is exposed) of the mask pattern without removing the shielding film pattern in the transfer areas.

Thus, a photomask composed of a translucent substrate having thereon a halftone phase shifter film pattern of 70 nm lines and spaces was produced.

Figure 4:
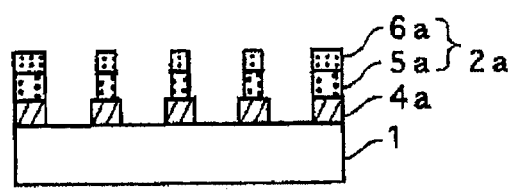
FIG. 4 shows a cross sectional view of a halftone phase shift mask obtained by the present invention.

In the halftone phase shift mask shown in FIG. 4, a shielding film is formed in the areas having the mask pattern of the phase shifter film excluding the boundaries of the translucent portions of the mask pattern (the areas where no mask pattern is formed and the transparent substrate is exposed), thereby more completely shielding the areas which should be completely shielded. More specifically, in the areas having the mask pattern, the phase shifter film as a mask pattern is required to pass the light with a shifted phase exclusively at the boundaries of the translucent portions. Other major portions excluding the boundaries should be completely lightproof. As exemplified by Example 5, the photomask of Example 5 is particularly suitable for a phase shifter film giving a high transmittance to exposure light.

Comparative Example 1

A photomask blank was produced in the same manner as Example 1, except that the antireflective layer was formed by reactive sputtering in an atmosphere of a mixed gas composed of an argon gas and a carbon dioxide gas (Ar: 92% by volume, $CO_2$: 8% by volume). The power of the sputtering apparatus and the total gas pressure during the formation of the antireflective layer film power were 0.35 kW and 0.20 pascals (Pa), respectively. The thickness of the shielding film was 70 nm. The composition of the shielding film was analyzed by Rutherford back scattering, and the result indicates that the film was a chromium (Cr) film containing 38.0 at % nitrogen (N), 12.1 at % oxygen (O), and 0 at % hydrogen (H). The composition was also analyzed by Auger electron spectroscopy, and the result indicates that the shielding film contained 10.8 at % carbon (C).

The sheet resistance of the shielding film was 200Ω/□ as measured by a four-terminal method.

Thereafter, a photomask was produced using the photomask blank in the same manner as Example 1. The etching rate was 2.1 Å/second, which is a very slow etching rate. The shielding film of Comparative Example 1 provided a slow etching rate and a long etching time, so that the sectional shape of the pattern of the shielding film was unsatisfactory. In addition, the shielding film pattern of 80 nm lines and spaces was not accurately formed.

(Method for Producing Semiconductor Device)

Each of the photomasks obtained in Examples 1 to 5 was mounted on an exposure apparatus, and the pattern was transferred to the resist film on the semiconductor substrate thereby producing a semiconductor device. This produced favorable semiconductor devices having no defect in the circuit pattern formed on the semiconductor substrates.

The shielding film exhibited good electrical conductivity and the sectional shape of the pattern was favorably vertical when the accelerating voltage of the electron beam was 50 keV or more during electron beam drawing in the production process for the photomasks of Examples 1 to 5. Thus, photomasks having a good pattern of 80 or 70 nm lines and spaces were obtained.

The following Examples 6 to 9 correspond to the third and fourth embodiments of the present invention.

Example 6

The photomask blank of Example 6 is composed of a translucent substrate 1 having thereon a shielding film 2, wherein the shielding film is composed of a shielding layer and an antireflective layer.

The photomask blank is produced by the method as described below.

The shielding layer 2 was formed on the translucent substrate 1 by reactive sputtering in an atmosphere of a mixed gas composed of an argon gas, a nitrogen gas, and a helium gas (Ar: 30% by volume, $N_2$: 30% by volume, He: 40% by volume) using a sputtering apparatus, and a chromium target as the sputtering target. Subsequently, the antireflective layer was formed by reactive sputtering in an atmosphere of a mixed gas composed of an argon gas, a methane gas, and a helium gas (Ar: 54% by volume, $CH_4$: 6% by volume, He: 40% by volume), followed by reactive sputtering in an atmosphere of a mixed gas composed of an argon gas and a nitric oxide gas (Ar: 90% by volume, NO: 10% by volume). Thus, the shielding film 2 was formed on the translucent substrate 1 composed of synthetic quartz glass. The shielding film was formed under the following conditions. The power of the sputtering apparatus and the total gas pressure during the formation of the shielding layer film were 1.16 kW, and 0.17 pascals (Pa), respectively. The power of the sputtering apparatus and the total gas pressure during the formation of the antireflective layer film power were 0.33 kW and 0.28 pascals (Pa), respectively. The ratio between the formation rate of the shielding layer and the formation rate of the antireflective layer was 3.2:1. The thickness of the shielding film was 67 nm. The composition of the shielding film was analyzed by Rutherford back scattering, and the result indicates that the film was a chromium (Cr) film containing 32.5 at % nitrogen (N), 12.8 at % oxygen (O), and 5.9 at % hydrogen (H). The composition was also analyzed by Auger electron spectroscopy, and the result indicates that the shielding film contained 8.0 at % carbon (C).

Figure 6:
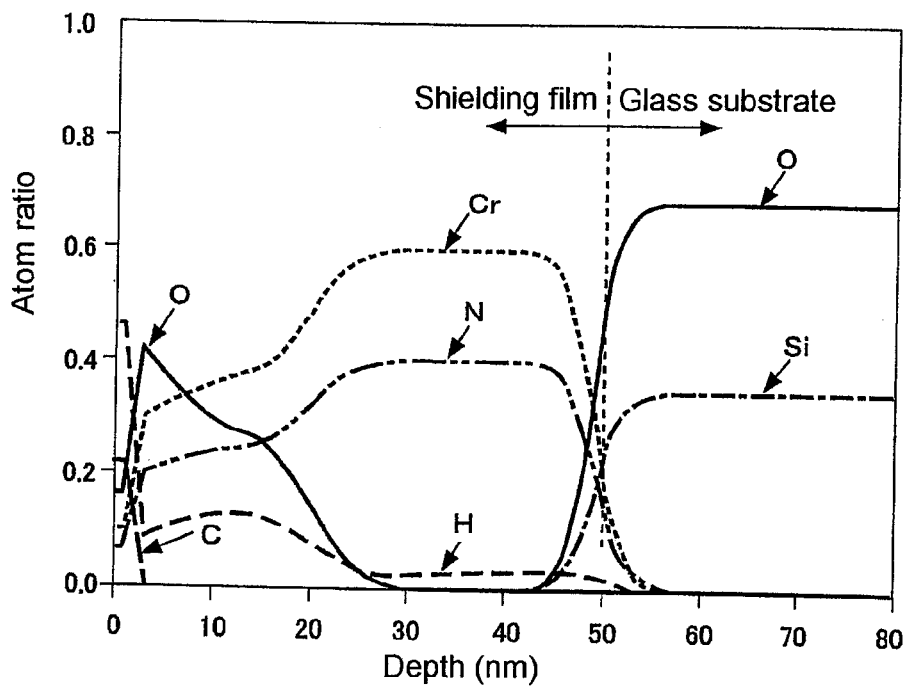
FIG. 6 is a graph showing the result of Rutherford back scattering analysis of the shielding film of Example 6.

FIG. 6 is a graph showing the result of the composition analysis along the depth direction of the shielding film of Example 1 by Rutherford back scattering analysis.

The result indicates that the shielding layer composing the shielding film was a graded composition film containing chromium and nitrogen, in addition, certain amounts of oxygen and carbon used for the formation of the antireflective layer. The antireflective layer was a graded composition film containing chromium, nitrogen, oxygen, and a certain amount of carbon. The shielding film contained hydrogen in all over the section along the depth direction. The hydrogen content was higher in the antireflective layer on the surface side. In the whole film, the hydrogen content decreased along the depth direction of the shielding film.

The shielding film gave an optical density of 3.0 at an exposure wavelength of 193 nm. The reflectance of the shielding film at the exposure wavelength of 193 nm was as low as 14.8%. The reflectances at the wavelengths of 257 nm and 364 nm used for the defect inspection of the photomask were 19.9% and 19.7%, respectively. These reflectances presented no problem for the inspection.

Thereafter, a chemically amplified resist film for electron beam drawing (FEP171, manufactured by Fujifilm Electronics Materials Co., Ltd.) was formed on the photomask blank 10. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film formed on the photomask blank using an electron beam drawing apparatus, and then the resist film was developed with a predetermined developing solution to form a resist pattern.

Subsequently, the shielding film 2 composed of the shielding layer and the antireflective layer was dry-etched along the resist pattern to form a shielding film pattern 2a. The dry etching gas was a mixed gas composed of a chlorine ($Cl_2$) gas and an oxygen ($O_2$) gas ($Cl_2:O_2$=4:1). The etching rates were 4.9 Å/second for the antireflective layer, 3.3 Å/second for the shielding layer, and 3.6 Å/second for the whole shielding film. The etching rate along the depth direction of the shielding film was higher at the surface side and lower at the translucent substrate side of the shielding film.

In Example 6, the formation rate of the antireflective layer was lower than the formation rate of the shielding layer of the shielding film 2. On this account, the dry etching rate moderately decreased along the depth direction of the shielding film, and global loading errors were within a practically allowable range. In addition, the shielding layer and the antireflective layer were composed mainly of nitrogen and oxygen, respectively, to increase the etching rate of the whole shielding film 2. Thus, the shielding film 2 had a small thickness and provided a high etching rate and a short etching time, so that the sectional shape of the shielding film pattern 2a was favorably vertical. The resist film remained on the shielding film pattern 2a.

Finally, residual portions of the resist pattern were removed, and thus a photomask was obtained. In this way, a photomask including a translucent substrate having thereon a shielding film pattern of 80 nm lines and spaces was produced.

Example 7

A shielding layer 2 was formed on a translucent substrate 1 by reactive sputtering in an atmosphere of a mixed gas composed of an argon gas and a nitrogen gas (Ar: 50% by volume and $N_2$: 50% by volume) using a chromium target as the sputtering target. Subsequently, an antireflective layer was formed by reactive sputtering in an atmosphere of a mixed gas composed of an argon gas, a methane gas, and a helium gas (Ar: 54% by volume, $CH_4$: 6% by volume, He: 40% by volume), followed by reactive sputtering in an atmosphere of a mixed gas composed of an argon gas and a nitric oxide gas (Ar: 90% by volume, NO: 10% by volume). Thus, a shielding film 2 was formed on the translucent substrate 1 composed of synthetic quartz glass. The shielding film was formed under the following conditions. The power of the sputtering apparatus and the total gas pressure during the formation of the shielding layer film were 0.9 kW, and 0.2 pascals (Pa), respectively. The power of the sputtering apparatus and the total gas pressure during the formation of the antireflective layer film power were 0.33 kW and 0.28 pascals (Pa), respectively. The ratio between the formation rate of the shielding layer and the formation rate of the antireflective layer was 3.8:1. The thickness of the shielding film was 65 nm.

Thereafter, a chemically amplified resist film for electron beam drawing (FEP171, manufactured by Fujifilm Electronics Materials Co., Ltd.) was formed on the photomask blank 10. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film formed on the photomask blank using an electron beam drawing apparatus, and then the resist film was developed with a predetermined developing solution to form a resist pattern.

Subsequently, the shielding film 2 composed of the shielding layer and the antireflective layer was dry-etched along the resist pattern to form a shielding film pattern 2a. The dry etching gas was a mixed gas composed of a chlorine ($Cl_2$) gas and an oxygen ($O_2$) gas ($Cl_2:O_2$=4:1). The etching rates were 4.9 Å/second for the antireflective layer, 2.9 Å/second for the shielding layer, and 3.2 Å/second for the whole shielding film. The etching rate along the depth direction of the shielding film was higher at the surface side and lower at the translucent substrate side of the shielding film.

In Example 7, the formation rate of the antireflective layer was lower than the formation rate of the shielding layer of the shielding film 2. On this account, the dry etching rate moderately decreased along the depth direction of the shielding film, and global loading errors were within a practically allowable range. In addition, the shielding layer and the antireflective layer were composed mainly of nitrogen and oxygen, respectively, to increase the etching rate of the whole shielding film 2. Thus, the shielding film 2 had a small thickness and provided a high etching rate and a short etching time, so that the sectional shape of the shielding film pattern 2a was favorably vertical. The resist film remained on the shielding film pattern 2a.

Finally, residual portions of the resist pattern were removed, and thus a photomask was obtained. In this way, a photomask including a translucent substrate having thereon a shielding film pattern of 80 nm lines and spaces was produced.

Example 8

FIG. 3 shows cross sectional views of the photomask according to Example 8 and a production process for a photomask using the photomask blank. As shown in FIG. 3(a), the photomask blank 30 of Example 8 is composed of a translucent substrate 1, a halftone phase shifter film 4 on the translucent substrate 1, and a shielding film 2 on the halftone phase shifter film 4, wherein the shielding film 2 is composed of a shielding layer 5 and an antireflective layer 6.

The photomask blank 30 is produced by the method as described below.

A halftone phase shifter film for ArF excimer laser (wavelength: 193 nm) which is a single layer composed mainly of molybdenum, silicon, and nitrogen and has a thickness of 69 nm was formed on a translucent substrate composed of synthetic quartz glass by reactive sputtering (DC sputtering) in an atmosphere of a mixed gas composed of an argon gas (Ar) and a nitrogen gas ($Ar:N_2$=10:90% by volume) using a single wafer sputtering apparatus and a mixed target composed of molybdenum (Mo) and silicon (Si) (Mo:Si=8:92 mol %) as the sputtering target. The halftone phase shifter film gives a transmittance of 5.5% and a phase shift of about 180° to an ArF excimer laser (wavelength: 193 nm).

Thereafter, a shielding film having a total thickness of 48 nm and including a shielding layer and an antireflective layer was formed on the halftone phase shifter film in the same manner as Example 6.

Subsequently, a chemically amplified resist film for electron beam drawing (FEP171, manufactured by Fuji Film Electronic Materials Co., Ltd., film thickness: 200 nm) was formed on the photomask blank. The resist film was formed by rotary coating using a spinner (rotary coating apparatus). The coating of the resist film was subjected to predetermined heat-drying treatment using a heat dryer.

Subsequently, an intended pattern (a pattern of 70 nm lines and spaces) was drawn on the resist film formed on the photomask blank 30 using an electron beam drawing apparatus, and then the resist film was developed with a predetermined developing solution to form a resist pattern 7 (see FIG. 3(b)).

Subsequently, the shielding film 2 composed of the shielding layer 5 and the antireflective layer 6 was dry-etched along the resist pattern 7 to form a shielding film pattern 2a (see FIG. 3(c)).

Subsequently, the halftone phase shifter film 4 was etched using the shielding film pattern 2a and the resist pattern 7 as a masks to form a halftone phase shifter film pattern 4a (see FIG. (d)). The sectional shape of the shielding film pattern 2a influences the etching of the halftone phase shifter film 4. The shielding film pattern 2a had a good sectional shape, so that the halftone phase shifter film pattern 4a also had a good sectional shape.

Subsequently, after removing residual portions of the resist pattern 7, the resist film 8 was applied again, and subjected to pattern exposure thereby removing unnecessary portions of the shielding film pattern in the transfer areas. Thereafter, the resist film 8 was developed to form a resist pattern 8a (see FIGS. 3(e) and 3(f)). Subsequently, unnecessary portions of the shielding film pattern were removed by wet etching, residual portions of the resist pattern were removed, and thus a photomask 40 was obtained (see FIG. 3(g)).

Thus, a photomask composed of a translucent substrate having thereon a halftone phase shifter film pattern of 70 nm lines and spaces was produced. Global loading errors were within a practically allowable range.

Example 9

A TaHf film having a thickness of 75 Å was formed on a translucent substrate composed of the same synthetic quartz glass as Example 6 by DC magnetron sputtering in an atmosphere of an argon (Ar) gas using a single wafer sputtering apparatus, and a mixed target (Ta:Hf=90:10 at %) composed of tantalum (Ta) and hafnium (Hf) as the sputtering target. Subsequently, a SiON film (Si:O:N=40:27:33 at %) having a thickness of 75 Å was formed by reactive sputtering in an atmosphere of a mixed gas composed of argon, oxygen, and nitrogen using an Si target. More specifically, a two-layer halftone phase shifter film for ArF excimer laser (wavelength: 193 nm) including the TaHf film as the lower layer and the SiON film as the upper layer was formed. The halftone phase shifter film gave a transmittance of as high as 15.0% and a phase shift of about 180° to an ArF excimer laser (wavelength: 193 nm).

Thereafter, a shielding film having a total thickness of 48 nm and including a shielding layer and an antireflective layer was formed on the halftone phase shifter film in the same manner as Example 8.

Using the photomask blank for halftone phase shift mask, a halftone phase shift mask was produced in the same manner as Example 8. In Example 9, as shown in FIG. 4, the shielding film was formed in the areas excluding the boundaries of the translucent portions (the areas where no mask pattern is formed and the transparent substrate is exposed) of the mask pattern without removing the shielding film pattern in the transfer areas.

Thus, a photomask composed of a translucent substrate having thereon a halftone phase shifter film pattern of 70 nm lines and spaces was produced. Global loading errors were within a practically allowable range.

Comparative Example 2

A shielding layer 2 was formed on a translucent substrate 1 by reactive sputtering in an atmosphere of a mixed gas composed of an argon gas, a nitrogen gas, and a helium gas (Ar: 30% by volume, $N_2$: 50% by volume, He: 40% by volume) using a chromium target as the sputtering target. Subsequently, an antireflective layer was formed by reactive sputtering in an atmosphere of a mixed gas composed of an argon gas, a methane gas, and a helium gas (Ar: 54% by volume, $CH_4$: 6% by volume, He: 40% by volume), followed by reactive sputtering in an atmosphere of a mixed gas composed of an argon gas and a nitric oxide gas (Ar: 90% by volume, NO: 10% by volume). Thus, a shielding film 2 was formed on the translucent substrate 1 composed of synthetic quartz glass. The shielding film was formed under the following conditions. The power of the sputtering apparatus and the total gas pressure during the formation of the shielding layer film were 0.33 kW, and 0.28 pascals (Pa), respectively. The power of the sputtering apparatus and the total gas pressure during the formation of the antireflective layer film power were 0.33 kW and 0.28 pascals (Pa), respectively. The ratio between the formation rate of the shielding layer and the formation rate of the antireflective layer was 1:1. The thickness of the shielding film was 70 nm.

Thereafter, a chemically amplified resist film for electron beam drawing (FEP171, manufactured by Fujifilm Electronics Materials Co., Ltd.) was formed on the photomask blank. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film formed on the photomask blank using an electron beam drawing apparatus, and then the resist film was developed with a predetermined developing solution to form a resist pattern.

Subsequently, the shielding film 2 composed of the shielding layer and the antireflective layer was dry-etched along the resist pattern to form a shielding film pattern 2a. The dry etching gas was a mixed gas composed of a chlorine ($Cl_2$) gas and an oxygen ($O_2$) gas ($Cl_2$:$O_2$=4:1). The etching rates were 4.2 Å/second for the antireflective layer, 4.2 Å/second for the shielding layer, and 4.2 Å/second for the whole shielding film. The etching rate along the depth direction of the shielding film was the same at the surface side and the translucent substrate side of the shielding film.

In Example 9, the shielding layer and the antireflective layer of the shielding film 2 were formed at the same rate, so that the dry etching rate was almost constant along the depth direction of the shielding film. On this account, global loading errors were significant and beyond a practically allowable range.

(Method for Producing Semiconductor Device)

Each of the photomasks obtained in Examples 6 to 9 was mounted on an exposure apparatus, and the pattern was transferred to the resist film on the semiconductor substrate thereby producing a semiconductor device. This produced favorable semiconductor devices having no defect in the circuit pattern formed on the semiconductor substrates.

The shielding film exhibited good electrical conductivity and the sectional shape of the pattern was favorably vertical when the accelerating voltage of the electron beam was 50 keV or more during electron beam drawing in the production process for the photomasks of Examples 1 to 5. Thus, photomasks having a good pattern of 80 or 70 nm lines and spaces were obtained. In addition, global loading errors of the photomasks were within a practically allowable range.

The following Examples 10 to 12 correspond to the fifth and sixth embodiments of the present invention.

Example 10

The photomask blank of Example 10 is composed of a translucent substrate 1 having thereon a shielding film 2, wherein the shielding film is composed of a shielding layer and an antireflective layer.

The photomask blank is produced by the method as described below.

The shielding layer was formed on the translucent substrate 1 by reactive sputtering in an atmosphere of a mixed gas composed of an argon gas, a nitrogen gas, and a helium gas (Ar: 30% by volume, $N_2$: 30% by volume, He: 40% by volume) using a sputtering apparatus, and a chromium target as the sputtering target. Subsequently, the antireflective layer was formed by reactive sputtering in an atmosphere of a mixed gas composed of an argon gas, a methane gas, and a helium gas (Ar: 54% by volume, $CH_4$: 6% by volume, He: 40% by volume), followed by reactive sputtering in an atmosphere of a mixed gas composed of an argon gas and a nitric oxide gas (Ar: 90% by volume, NO: 10% by volume). Thus, the shielding film 2 was formed on the translucent substrate 1 composed of synthetic quartz glass. The shielding film was formed under the following conditions. The power of the sputtering apparatus and the total gas pressure during the formation of the shielding layer film were 1.16 kW, and 0.17 pascals (Pa), respectively. The power of the sputtering apparatus and the total gas pressure during the formation of the antireflective layer film power were 0.33 kW and 0.28 pascals (Pa), respectively. The ratio between the formation rate of the shielding layer and the formation rate of the antireflective layer was 3.2:1. The thickness of the shielding film was 67 nm. The composition of the shielding film was analyzed by Rutherford back scattering, and the result indicates that the film was a chromium (Cr) film containing 32.5 at % nitrogen (N), 12.8 at % oxygen (O), and 5.9 at % hydrogen (H). The composition was also analyzed by Auger electron spectroscopy, and the result indicates that the shielding film contained 8.0 at % carbon (C).

Figure 7:
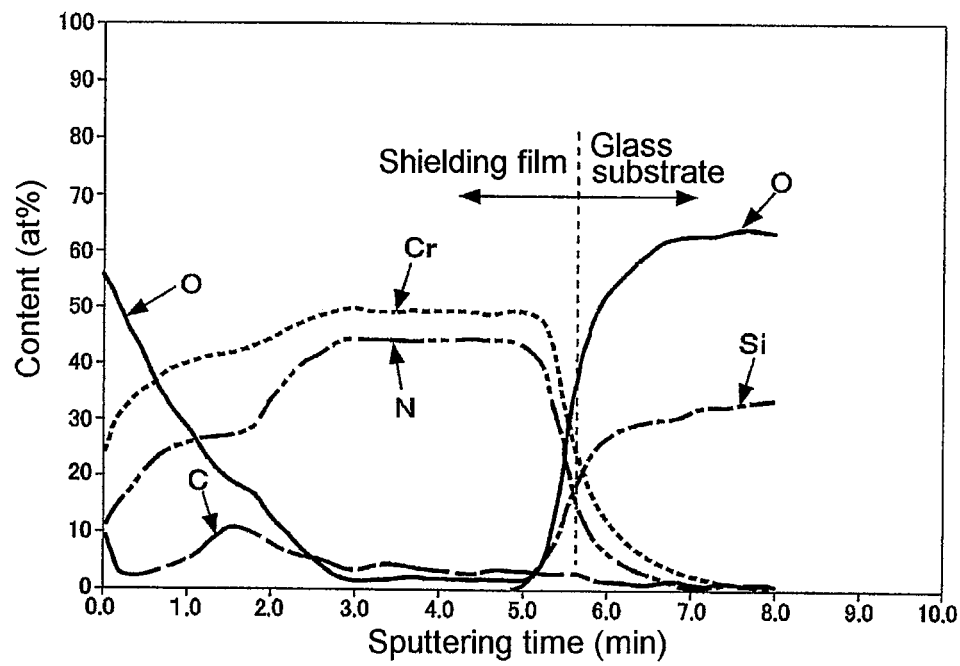
FIG. 7 is a graph showing the result of Auger spectroscopic analysis of the shielding film of Example 10.

FIG. 7 is a graph showing the result of the composition analysis along the depth direction of the shielding film of Example 10 by Rutherford back scattering analysis.

The result indicates that the shielding layer composing the shielding film was a graded composition film containing chromium and nitrogen, in addition, certain amounts of oxygen and carbon used for the formation of the antireflective layer. The antireflective layer was a graded composition film containing chromium, nitrogen, oxygen, and a certain amount of carbon.

Figure 8:
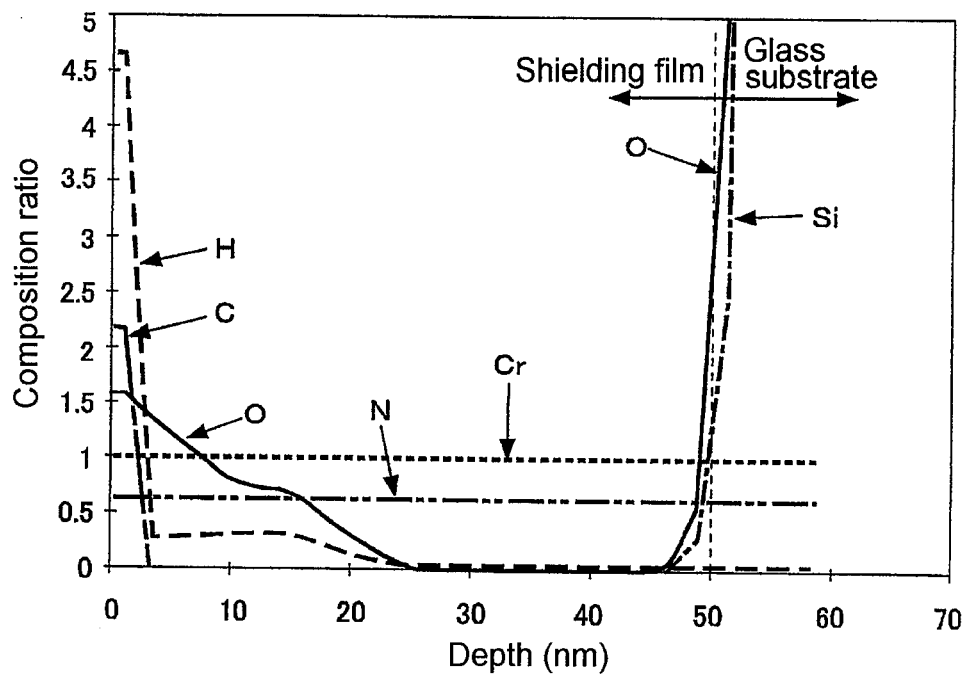
FIG. 8 is a graph showing the result of Rutherford back scattering analysis of the shielding film of Example 10.

FIG. 8 is a graph showing the result of Rutherford back scattering analysis of the shielding film of Example 10. The graph indicates the distributions of chromium (Cr), nitrogen (N), oxygen (O), hydrogen (H), and carbon (C) from the surface side toward the translucent substrate side of the shielding film with reference to the composition ratio of Cr. As shown in FIG. 8, nitrogen (N) was contained in all over the section along the depth direction from the surface side toward the translucent substrate side of the shielding film, and the oxygen (O) content decreased from the surface side toward the translucent substrate side. The hydrogen (H) content decreased from the surface side toward the translucent substrate side. Nitrogen (N) was almost uniformly contained in almost all regions from the surface side toward the translucent substrate side, and the nitrogen (N) content was from 0.65 and 0.67 with reference to the proportion (composition ratio) of chromium (Cr) contained in the shielding film.

The shielding film gave an optical density of 3.0. The reflectance of the shielding film at the exposure wavelength of 193 nm was as low as 14.8%. The reflectances at the wavelengths of 257 nm and 364 nm used for the defect inspection of the photomask were 19.9% and 19.7%, respectively. These reflectances presented no problem for the inspection.

Thereafter, a chemically amplified resist film for electron beam drawing (FEP171, manufactured by Fujifilm Electronics Materials Co., Ltd.) was formed on the photomask blank 10. The resist film was formed by rotary coating using a spinner (rotary coating apparatus). The coating of the resist film was subjected to predetermined heat-drying treatment using a heat dryer.

Subsequently, an intended pattern (a pattern of 80 nm lines and spaces) was drawn on the resist film formed on the photomask blank using an electron beam drawing apparatus, and then the resist film was developed with a predetermined developing solution to form a resist pattern.

Subsequently, the shielding film 2 composed of the shielding layer and the antireflective layer was dry-etched along the resist pattern to form a shielding film pattern 2a. The dry etching gas was a mixed gas composed of a chlorine ($Cl_2$) gas and an oxygen ($O_2$) gas ($Cl_2:O_2$=4:1). The etching rates were 4.9 Å/second for the antireflective layer, 3.3 Å/second for the shielding layer, and 3.6 Å/second for the whole shielding film. The etching rate along the depth direction of the shielding film was higher at the surface side and lower at the translucent substrate side of the shielding film.

In Example 10, the formation rate of the antireflective layer was lower than the formation rate of the shielding layer of the shielding film 2. On this account, the dry etching rate moderately decreased along the depth direction of the shielding film, and global loading errors were within a practically allowable range. Thus, the shielding film 2 had a small thickness and provided a high etching rate and a short etching time, so that the sectional shape of the shielding film pattern 2a was favorably vertical. The resist film remained on the shielding film pattern 2a.

Finally, residual portions of the resist pattern were removed, and thus a photomask was obtained. In this way, a photomask including a translucent substrate having thereon a shielding film pattern of 80 nm lines and spaces was produced.

Example 11

FIG. 3 shows cross sectional views of the photomask according to Example 11 and a production process for a photomask using the photomask blank. As shown in FIG. 3(a), the photomask blank 30 of Example 4 is composed of a translucent substrate 1, a halftone phase shifter film 4 on the translucent substrate 1, and a shielding film 2 on the halftone phase shifter film 4, wherein the shielding film 2 is composed of a shielding layer 5 and an antireflective layer 6.

The photomask blank 30 is produced by the method as described below.

A halftone phase shifter film for ArF excimer laser (wavelength: 193 nm) which is a single layer composed mainly of molybdenum, silicon, and nitrogen and has a thickness of 69 nm was formed on a translucent substrate composed of synthetic quartz glass by reactive sputtering (DC sputtering) in an atmosphere of a mixed gas composed of an argon gas (Ar) and a nitrogen gas ($Ar:N_2$=10:90% by volume) using a single wafer sputtering apparatus and a mixed target composed of molybdenum (Mo) and silicon (Si) (Mo:Si=8:92 mol %) as the sputtering target. The halftone phase shifter film gave a transmittance of 5.5% and a phase shift of about 180° to an ArF excimer laser (wavelength: 193 nm).

Thereafter, a shielding film having a total thickness of 48 nm and including a shielding layer and an antireflective layer was formed on the halftone phase shifter film in the same manner as Example 10.

Subsequently, a chemically amplified resist film for electron beam drawing (FEP171, manufactured by Fujifilm Electronic Materials Co., Ltd., film thickness: 200 nm) was formed on the photomask blank 30. The resist film was formed by rotary coating using a spinner (rotary coating apparatus). The coating of the resist film was subjected to predetermined heat-drying treatment using a heat dryer.

Subsequently, an intended pattern (a pattern of 70 nm lines and spaces) was drawn on the resist film formed on the photomask blank 30 using an electron beam drawing apparatus, and then the resist film was developed with a predetermined developing solution to form a resist pattern 7 (see FIG. 3(*b*)).

Subsequently, the shielding film 2 composed of the shielding layer 5 and the antireflective layer 6 was dry-etched along the resist pattern 7 to form a shielding film pattern 2*a* (see FIG. 3(*c*)).

Subsequently, the halftone phase shifter film 4 was etched using the shielding film pattern 2*a* and the resist pattern 7 as a masks to form a halftone phase shifter film pattern 4*a* (see FIG. 3(*d*)). The sectional shape of the shielding film pattern 2*a* influences the etching of the halftone phase shifter film 4. The shielding film pattern 2*a* had a good sectional shape, so that the halftone phase shifter film pattern 4*a* also had a good sectional shape.

Subsequently, after removing residual portions of the resist pattern 7, the resist film 8 was applied again, and subjected to pattern exposure thereby removing unnecessary portions of the shielding film pattern in the transfer areas. Thereafter, the resist film 8 was developed to form a resist pattern 8*a* (see FIGS. 3(*e*) and 3(*f*)). Subsequently, unnecessary portions of the shielding film pattern were removed by wet etching, residual portions of the resist pattern were removed, and thus a photomask 40 was obtained (see FIG. 3(*g*)).

Thus, a photomask composed of a translucent substrate having thereon a halftone phase shifter film pattern of 70 nm lines and spaces was produced. Global loading errors were within a practically allowable range.

Example 12

A TaHf film having a thickness of 75 Å was formed on a translucent substrate composed of the same synthetic quartz glass as Example 10 by DC magnetron sputtering in an atmosphere of an argon (Ar) gas using a single wafer sputtering apparatus, and a mixed target (Ta:Hf=90:10 at %) composed of tantalum (Ta) and hafnium (Hf) as the sputtering target. Subsequently, a SiON film (Si:O:N=40:27:33 at %) having a thickness of 740 Å was formed by reactive sputtering in an atmosphere of a mixed gas composed of argon, oxygen, and nitrogen using an Si target. More specifically, a two-layer halftone phase shifter film for ArF excimer laser (wavelength: 193 nm) including the TaHf film as the lower layer and the SiON film as the upper layer was formed. The halftone phase shifter film gave a transmittance of as high as 15.0% and a phase shift of about 180° to an ArF excimer laser (wavelength: 193 nm).

Thereafter, a shielding film having a total thickness of 48 nm and including a shielding layer and an antireflective layer was formed on the halftone phase shifter film in the same manner as Example 11.

Using the photomask blank for halftone phase shift mask, a halftone phase shift mask was produced in the same manner as Example 11. In Example 12, as shown in FIG. 4, the shielding film was formed in the areas excluding the boundaries of the translucent portions (the areas where no mask pattern is formed and the transparent substrate is exposed) of the mask pattern without removing the shielding film pattern in the transfer areas.

Thus, a photomask composed of a translucent substrate having thereon a halftone phase shifter film pattern of 70 nm lines and spaces was produced. Global loading errors were within a practically allowable range.

Comparative Example 3

A shielding layer was formed on a translucent substrate composed of the same quartz glass as Example 10 by reactive sputtering in an atmosphere of a mixed gas composed of argon and nitrogen (Ar: 50% by volume, N:50% by volume), followed by reactive sputtering in an atmosphere of a mixed gas composed of argon, methane, and helium (Ar: 54% by volume, $CH_4$: 6% by volume, He: 40% by volume) using an in-line sputtering apparatus and a chromium target as the sputtering target. Subsequently, an antireflective layer was formed by reactive sputtering in an atmosphere of a mixed gas composed of argon and nitric oxide (Ar: 90% by volume, NO: 10% by volume). Thus, a shielding film having a total film thickness of 68 nm and including a shielding layer and an antireflective layer was formed.

The shielding film of Comparative Example 3 gave an optical density of 3.0. The reflectance of the shielding film at the exposure wavelength of 193 nm was as low as 12.0.

Thereafter, a photomask was produced using the photomask blank in the same manner as Example 10. The etching rate was 1.8 Å/second in terms of the total thickness of the shielding film/etching time, which is a very slow etching rate. The shielding film of Comparative Example 3 provided a slow etching rate and a long etching time, so that the sectional shape of the pattern of the shielding film was unsatisfactory. In addition, the resist film was significantly damaged. The reason for the low dry etching rate is considered as follows. The shielding film of Comparative Example 3 has a structure suitable for wet etching, and, according to the film formation conditions, the content of carbon which is suitable for increase the wet etching was high, while the content of nitrogen was so low that the undercut was suppressed. In addition, along the depth direction of the shielding film, the dry etching rate was fast at first, and decreased in the CrC film region, and increased again in the CrN film region. This is considered to have caused the deterioration of the sectional shape of the pattern and the frequent occurrence of the global loading phenomenon.

As a result of this, a photomask including a translucent substrate having thereon a shielding film pattern of 80 nm lines and spaces was produced, but global loading errors were beyond a practically allowable range.

In Example 10 to 12, when the nitrogen (N) content in almost all regions from the surface side toward the translucent substrate side was from 0.5 to 0.8 with reference to the proportion (composition ratio) of chromium (Cr) contained in the shielding film, the dry etching rate increased. In addition, when the oxygen content in the shielding film decreased from the surface side toward the translucent substrate side, the occurrence of global loading phenomenon was reduced, and the pattern accuracy and the sectional shape of the pattern were improved.

(Method for Producing Semiconductor Device)

Each of the photomasks obtained in Examples 10 to 12 was mounted on an exposure apparatus, and the pattern was transferred to the resist film on the semiconductor substrate thereby producing a semiconductor device. This produced favorable semiconductor devices having no defect in the circuit pattern formed on the semiconductor substrates.

The shielding film exhibited good electrical conductivity and the sectional shape of the pattern was favorably vertical when the accelerating voltage of the electron beam was 50 keV or more during electron beam drawing in the production process for the photomasks of Examples 10 to 12. Thus, photomasks having a good pattern of 80 or 70 nm lines and spaces were obtained. In addition, global loading errors of the photomasks were within a practically allowable range.

The invention claimed is:

1. A photomask blank suitable for production of a photomask that has a mask film dry etched into a mask pattern, comprising:
    a glass substrate defining a glass substrate side of said blank; and
    a first film to serve as said mask film and being formed on the substrate and composed of a chromium-containing material;
    the first film contains nitrogen in substantially an entire volume of said first film along a depth direction from a surface side toward the glass substrate side of the first film, and
    a content of an oxygen in the first film decreases from the surface side toward the glass substrate side,
    wherein the first film has a nitrogen content at the surface side which is lower than a nitrogen content at the glass substrate side.

2. A photomask blank suitable for production of a photomask that has a mask film dry etched into a mask pattern, comprising:
    a glass substrate defining a glass substrate side of said blank; and
    a first film to serve as said mask film and being formed on the substrate and composed of a chromium-containing material;
    the first film contains nitrogen in substantially an entire volume of said first film along a depth direction from a surface side toward the glass substrate side of the first film, and
    a content of an oxygen in the first film decreases from the surface side toward the glass substrate side,
    wherein a content of the nitrogen in the regions from the surface side of said first film, toward the glass substrate side of the first film is within a range of 0.5 to 0.8 with reference to a proportion of chromium contained in the first film.

3. The photomask blank according to claim 1, wherein a content of the nitrogen is from 15 to 80 at %.

4. The photomask blank according to claim 1, wherein the content of the oxygen is from 5 to 80 at %.

5. The photomask blank according to claim 1, wherein a total content of the oxygen and the nitrogen is from 10 to 80 at %.

6. The photomask blank according to claim 1, wherein a second film composed of a material containing molybdenum, tungsten, tantalum or hafnium is formed between the glass substrate and the first film.

7. The photomask blank according to claim 1, wherein a third film composed of a material containing molybdenum, silicon and nitrogen is formed between the glass substrate and the first film.

8. The photomask blank according to claim 1, further comprising:
    a resist film formed on the first film.

9. A method for producing a photomask, comprising the step of:
    patterning the first film of the photomask blank according to claim 1 by dry etching to form a film pattern composed of a chromium-containing material on the glass substrate.

10. A method for producing a photomask, comprising steps of: patterning the first film of the photomask blank according to claim 6 by dry etching to form a film pattern composed of a chromium-containing material, and
    then patterning the second film by dry etching using the film pattern composed of the chromium-containing material as a mask to form a film pattern composed of a material containing molybdenum, tungsten, tantalum or hafnium on the glass substrate.

11. A method for producing a photomask, comprising steps of: patterning the first film of the photomask blank according to claim 7 by dry etching to form a film pattern composed of a chromium-containing material, and
    then patterning the third film by dry etching using the film pattern composed of the chromium-containing material as a mask to form a film pattern composed of a material containing molybdenum, silicon and nitrogen on the glass substrate.

12. The photomask blank according to claim 2, wherein a content of the nitrogen is from 15 to 80 at%.

13. The photomask blank according to claim 2, wherein the content of the oxygen is from 5 to 80 at%.

14. The photomask blank according to claim 2, wherein a total content of the oxygen and the nitrogen is from 10 to 80 at%.

15. The photomask blank according to claim 2, wherein a second film composed of a material containing molybdenum, tungsten, tantalum or hafnium is formed between the substrate and the first film.

16. The photomask blank according to claim 2, wherein a third film composed of a material containing molybdenum, silicon and nitrogen is formed between the substrate and the first film.

17. The photomask blank according to claim 2, further comprising:
    a resist film formed on the first film.

18. A method for producing a photomask, comprising the step of:
    patterning the first film of the photomask blank according to claim 2 by dry etching to form a film pattern composed of a chromium-containing material on the glass substrate.

19. A method for producing a photomask, comprising steps of: patterning the first film of the photomask blank according to claim 15 by dry etching to form a film pattern composed of a chromium-containing material, and
    then patterning the second film by dry etching using the film pattern composed of the chromium-containing material as a mask to form a film pattern composed of a material containing molybdenum, tungsten, tantalum or hafnium on the glass substrate.

20. A method for producing a photomask, comprising steps of: patterning the first film of the photomask blank according to claim 16 by dry etching to form a film pattern composed of a chromium-containing material, and
    then patterning the third film by dry etching using the film pattern composed of the chromium-containing material as a mask to form a film pattern composed of a material containing molybdenum, silicon and nitrogen on the glass substrate.

* * * * *